(12) United States Patent
Ohashi et al.

(10) Patent No.: US 10,777,675 B2
(45) Date of Patent: Sep. 15, 2020

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Teruyuki Ohashi, Kawasaki (JP); Ryosuke Iijima, Setagaya (JP); Hiroshi Kono, Himeji (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 32 days.

(21) Appl. No.: 15/430,794

(22) Filed: Feb. 13, 2017

(65) Prior Publication Data
US 2017/0365709 A1    Dec. 21, 2017

(30) Foreign Application Priority Data
Jun. 20, 2016 (JP) .................... 2016-121783

(51) Int. Cl.
*H01L 29/78* (2006.01)
*H01L 29/66* (2006.01)
(Continued)

(52) U.S. Cl.
CPC ...... *H01L 29/7813* (2013.01); *H01L 21/0465* (2013.01); *H01L 29/0623* (2013.01);
(Continued)

(58) Field of Classification Search
CPC ............ H01L 29/0646; H01L 29/0865; H01L 29/0869; H01L 29/7813; H01L 21/0465
(Continued)

(56) References Cited

U.S. PATENT DOCUMENTS 5,451,800 A * 9/1995 Mohammad ...... H01L 29/66666
257/191
5,895,939 A   4/1999 Ueno
(Continued)

FOREIGN PATENT DOCUMENTS

JP      H09-036359 A     2/1997
JP      2002-538623 A    11/2002
(Continued)

*Primary Examiner* — Marvin Payen
*Assistant Examiner* — Vernon P Webb
(74) *Attorney, Agent, or Firm* — Oblon, McClelland, Maier & Neustadt, L.L.P.

(57) ABSTRACT

A semiconductor device according to an embodiment includes a SiC layer having a first and a second plane, a first SiC region of a first conductivity type, second and third SiC regions of a second conductivity type provided between the first SiC region and the first plane, a fourth SiC region of the first conductivity type provided between the second SiC region and the first plane, a fifth SiC region of the first conductivity type provided between the third SiC region and the first plane, a gate electrode provided between the second SiC region and the third SiC region, a gate insulating layer, a sixth SiC region of the second conductivity type provided between the first SiC region and the second SiC region, and a seventh SiC region of the second conductivity type provided between the first SiC region and the third SiC region.

23 Claims, 28 Drawing Sheets

(51) Int. Cl.
  *H01L 29/423* (2006.01)
  *H01L 29/10* (2006.01)
  *H01L 29/08* (2006.01)
  *H01L 29/16* (2006.01)
  *H01L 29/739* (2006.01)
  *H01L 29/06* (2006.01)
  *H01L 21/04* (2006.01)

(52) U.S. Cl.
  CPC ........ *H01L 29/0646* (2013.01); *H01L 29/086* (2013.01); *H01L 29/0865* (2013.01); *H01L 29/0869* (2013.01); *H01L 29/0878* (2013.01); *H01L 29/0882* (2013.01); *H01L 29/0886* (2013.01); *H01L 29/1095* (2013.01); *H01L 29/1608* (2013.01); *H01L 29/42368* (2013.01); *H01L 29/66068* (2013.01); *H01L 29/66734* (2013.01); *H01L 29/66348* (2013.01); *H01L 29/7396* (2013.01); *H01L 29/7397* (2013.01)

(58) Field of Classification Search
  USPC .................................................. 257/77, 139
  See application file for complete search history.

(56) References Cited

U.S. PATENT DOCUMENTS

| | | | |
|---|---|---|---|
| 7,138,668 | B2 | 11/2006 | Hayashi et al. |
| 9,082,815 | B2 | 7/2015 | Sugimoto et al. |
| 2002/0142527 | A1 | 10/2002 | Gassel et al. |
| 2009/0289264 | A1 | 11/2009 | Matsuki et al. |
| 2014/0319577 | A1* | 10/2014 | Sugimoto ........... H01L 29/7397 257/139 |
| 2015/0053999 | A1* | 2/2015 | Kumagai ............ H01L 29/0615 257/77 |
| 2016/0284834 | A1* | 9/2016 | Shimizu ................ H01L 21/045 |

FOREIGN PATENT DOCUMENTS

| | | |
|---|---|---|
| JP | 2005-51096 | 2/2005 |
| JP | 2007-59805 A | 3/2007 |
| JP | 2007-129259 A | 5/2007 |
| JP | 3966249 | 8/2007 |
| JP | 2009-283540 | 12/2009 |
| JP | 2014-216410 | 11/2014 |
| JP | 2015-128082 A | 7/2015 |

* cited by examiner

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2016-121783, filed on Jun. 20, 2016, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) is expected to be used as a material for a next-general semiconductor device. SiC has better physical properties than silicon (Si). For example, SiC has a bandgap that is three times wider than that of Si, a breakdown field strength that is about ten times higher than that of Si, and a thermal conductivity that is about three times higher than that of Si. These physical properties are used to achieve a semiconductor device which has low loss and can operate at a high temperature.

However, for example, when silicon carbide is used to form a metal insulator semiconductor (MIS) structure, there is a concern that the breakdown voltage of a gate insulating layer will become lower than the breakdown voltage of a semiconductor, since the breakdown voltage of silicon carbide is high. In particular, when the MIS structure is formed in a trench in order to increase an integrity of a device, the breakdown voltage of the gate insulating layer is reduced due to the concentration of the electric field at the bottom of the trench.

DETAILED DESCRIPTION

Figure 1:
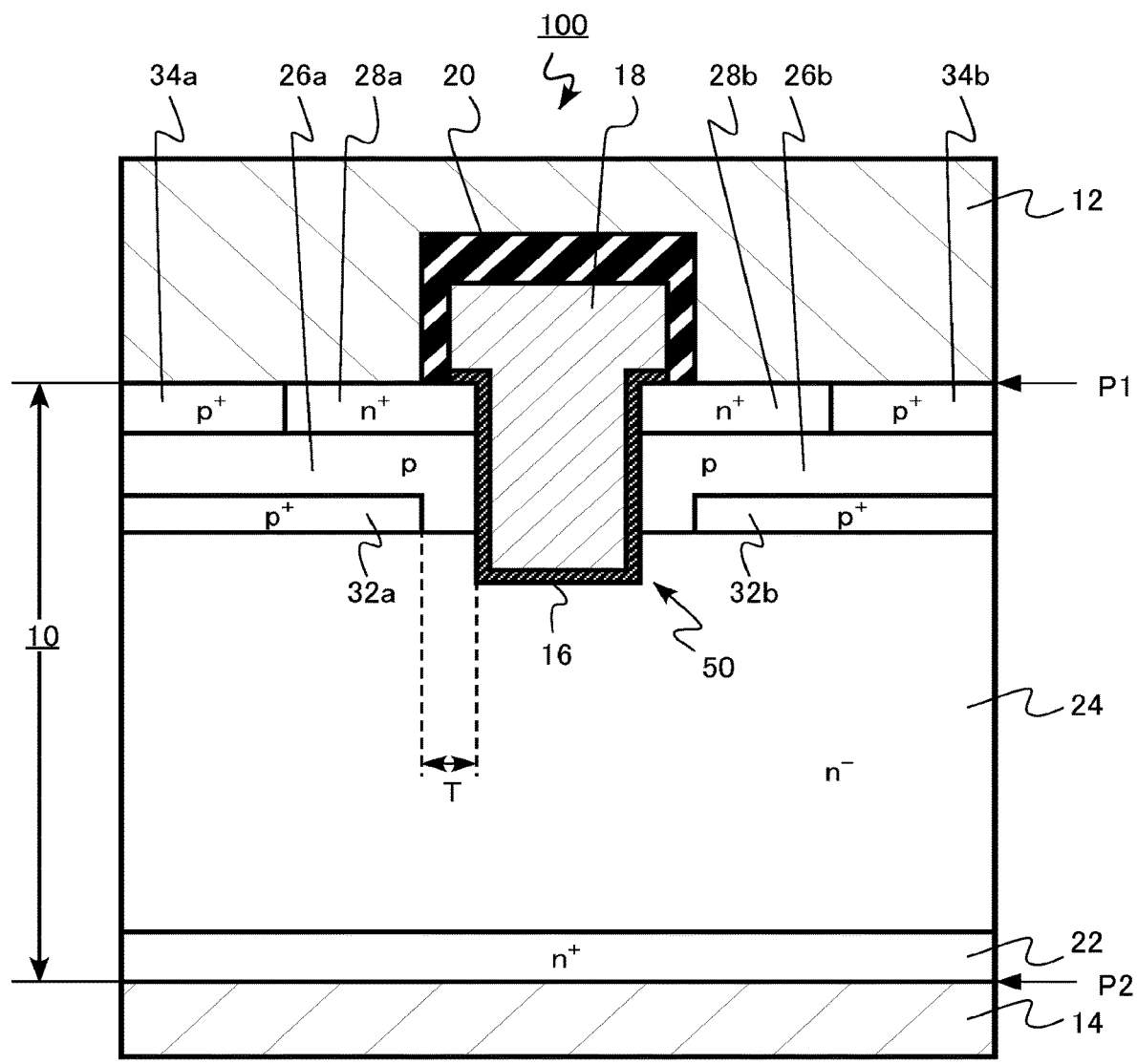
FIG. 1 is a cross-sectional view schematically illustrating a semiconductor device according to a first embodiment.

A semiconductor device according to an embodiment includes a silicon carbide layer having a first plane and a second plane, a first silicon carbide region of a first conductivity type provided in the silicon carbide layer, a second silicon carbide region of a second conductivity type provided between the first silicon carbide region and the first plane, a third silicon carbide region of the second conductivity type provided between the first silicon carbide region and the first plane, a fourth silicon carbide region of the first conductivity type provided between the second silicon carbide region and the first plane, a fifth silicon carbide region of the first conductivity type provided between the third silicon carbide region and the first plane, a gate electrode having a portion provided between the second silicon carbide region and the third silicon carbide region, a gate insulating layer having a portion provided between the second silicon carbide region and the gate electrode and a portion between the third silicon carbide region and the gate electrode, a sixth silicon carbide region of the second conductivity type provided between the first silicon carbide region and the second silicon carbide region, a part of the second silicon carbide region being interposed between the sixth silicon carbide region and the gate insulating layer, and the sixth silicon carbide region having a higher second-conductivity-type impurity concentration than the second silicon carbide region, and a seventh silicon carbide region of the second conductivity type provided between the first silicon carbide region and the third silicon carbide region, a part of the third silicon carbide region being interposed between the seventh silicon carbide region and the gate insulating layer, and the seventh silicon carbide region having a higher second-conductivity-type impurity concentration than the third silicon carbide region.

Hereinafter, embodiments of the invention will be described with reference to the drawings. In the following description, the same or similar members are denoted by the same reference numerals and the description thereof will not be repeated.

In the following description, n$^+$, n, n$^-$, p$^+$, p, and p$^-$ indicate the relative levels of impurity concentration in each conductivity type. That is, n$^+$ indicates an n-type impurity concentration which is higher than that of n and n$^-$ indicates an n-type impurity concentration which is lower than that of n. In addition, p$^+$ indicates a p-type impurity concentration which is higher than that of p and p$^-$ indicates a p-type impurity concentration which is lower than that of p. In some cases, an n$^+$ type and an n$^-$ type are simply referred to as an n type and a p$^+$ type and a p$^-$ type are simply referred to as a p type.

First Embodiment

A semiconductor device according to this embodiment includes a silicon carbide layer having a first plane and a second plane, a first silicon carbide region of a first conductivity type which is provided in the silicon carbide layer, a second silicon carbide region of a second conductivity type which is provided between the first silicon carbide region and the first plane, a third silicon carbide region of the second conductivity type which is provided between the first silicon carbide region and the first plane, a fourth silicon carbide region of the first conductivity type which is provided between the second silicon carbide region and the first plane, a fifth silicon carbide region of the first conductivity type which is provided between the third silicon carbide region and the first plane, a gate electrode having at least a portion provided between the second silicon carbide region and the third silicon carbide region, a gate insulating layer having at least a portion provided between the second silicon carbide region and the gate electrode and between the third silicon carbide region and the gate electrode, a sixth silicon carbide region of the second conductivity type which is provided between the first silicon carbide region and the second silicon carbide region, faces the gate insulating layer with the second silicon carbide region interposed therebetween, and has a higher second-conductivity-type impurity concentration than the second silicon carbide region, and a seventh silicon carbide region of the second conductivity type which is provided between the first silicon carbide region and the third silicon carbide region, faces the gate insulating layer with the third silicon carbide region interposed therebetween, and has a higher second-conductivity-type impurity concentration than the third silicon carbide region.

FIG. 1 is a cross-sectional view schematically illustrating the semiconductor device according to this embodiment. A metal oxide semiconductor field effect transistor (MOSFET) 100 is, for example, a double implantation MOSFET (DI-MOSFET) in which a well region and a source region are formed by ion implantation. In addition, the MOSFET 100 is a trench gate MOSFET in which a gate insulating layer and a gate electrode are provided in a trench.

Hereinafter, an example in which a first conductivity type is an n type and a second conductivity type is a p type will be described. The MOSFET 100 is an n-type MOSFET having electrons as carriers.

The MOSFET 100 includes a silicon carbide layer (SiC layer) 10, a source electrode 12, a drain electrode 14, a gate insulating layer 16, a gate electrode 18, an interlayer insulating film 20, and a trench 50. The SiC layer 10 includes a drain region (SiC substrate) 22, a drift region (first silicon carbide region) 24, a first p well region (second silicon carbide region) 26a, a second p well region (third silicon carbide region) 26b, a first source region (fourth silicon carbide region) 28a, a second source region (fifth silicon carbide region) 28b, a first high-concentration p region (sixth silicon carbide region) 32a, a second high-concentration p region (seventh silicon carbide region) 32b, a first contact region (eleventh silicon carbide region) 34a, and a second contact region (twelfth silicon carbide region) 34b.

The SiC layer 10 is, for example, a 4H—SiC single-crystal layer.

SiC can have a plurality of crystal forms. Examples of SiC include 4H—SiC which is a hexagonal crystal system, 6H—SiC which is a hexagonal crystal system, and 3C—SiC which is a cubic crystal system. The arrangement of atoms in SiC can be observed by, for example, a transmission electron microscope (TEM) to identify the crystal form of SiC. In addition, the arrangement of atoms in SiC can be observed by, for example, X-ray diffraction (XRD) to identify the crystal form of SiC.

The SiC layer 10 has a first plane and a second plane. In FIG. 1, the first plane is an upper plane and the second plane is a lower plane. Hereinafter, the first plane is referred to as a front surface and the second plane is referred to as a rear surface.

An example in which the first plane is inclined at an angle that is equal to or greater than 0 degrees and equal to or less than 8 degrees with respect to a (0001) face and the second plane is inclined at an angle that is equal to or greater than 0 degrees and equal to or less than 8 degrees with respect to a (000-1) face will be described. The (0001) face is referred to as a silicon face. The (000-1) face is referred to as a carbon face.

The drain region 22 is made of n-type SiC. The drain region 22 includes, for example, nitrogen (N) as n-type impurities. The n-type impurity concentration of the drain region 22 is, for example, equal to or greater than $1\times10^{18}$ cm$^{-3}$ and equal to or less than $1\times10^{21}$ cm$^{-3}$.

The n-type impurity concentration of the drain region 22 in the second plane is preferably equal to or greater than $1\times10^{19}$ cm$^{-3}$ and more preferably equal to or greater than $1\times10^{20}$ cm$^{-3}$ in order to reduce the contact resistance between the drain electrode 14 and the drain region 22.

The drift region 24 is provided on the drain region 22. The drift region 24 is, for example, an n$^-$ SiC region that is formed on the drain region 22 by epitaxial growth. The thickness of the drift region 24 is, for example, equal to or greater than 5 μm and equal to or less than 150 μm.

The drift region 24 includes, for example, nitrogen (N) as n-type impurities. The n-type impurity concentration of the drift region 24 is lower than the n-type impurity concentration of the drain region 22. The n-type impurity concentration of the drift region 24 is, for example, equal to or greater than $1\times10^{14}$ cm$^{-3}$ and equal to or less than $1\times10^{17}$ cm$^{-3}$.

The first p well region 26a and the second p well region 26b are provided between the drift region 24 and the first plane. The first p well region 26a and the second p well region 26b are made of p-type SiC.

The first p well region 26a is provided between the first source region 28a and the drift region 24. The second p well region 26b is provided between the second source region 28b and the drift region 24. The first p well region 26a and the second p well region 26b function as the channel regions of the MOSFET 100.

The first p well region 26a and the second p well region 26b are made of p-type SiC. The first p well region 26a and the second p well region 26b include, for example, aluminum (Al) as p-type impurities. The p-type impurity concentration of the first p well region 26a and the second p well region 26b is, for example, equal to or greater than $5\times10^{15}$ cm$^{-3}$ and equal to or less than $1\times10^{18}$ cm$^{-3}$.

The depth of the first p well region 26a and the second p well region 26b is, for example, equal to or greater than 0.4 μm and equal to or less than 0.9 μm. In the specification, the "depth" means the distance from the front surface of the SiC layer 10.

The first source region 28a is provided between the first p well region 26a and the first plane. The second source region 28b is provided between the second p well region 26b and the first plane of the SiC layer 10.

The first source region 28a and the second source region 28b are made of n$^+$ SiC. The first source region 28a and the second source region 28b include, for example, nitrogen (N) as n-type impurities.

The n-type impurity concentration of the first source region 28a and the second source region 28b is higher than the n-type impurity concentration of the drift region 24. The n-type impurity concentration of the first source region 28a and the second source region 28b is, for example, equal to or greater than $1\times10^{18}$ cm$^{-3}$ and equal to or less than $1\times10^{21}$ cm$^{-3}$.

The n-type impurity concentration of the first source region 28a and the second source region 28b in the first plane is preferably equal to or greater than $1\times10^{19}$ cm$^{-3}$ and more preferably equal to or greater than $1\times10^{20}$ cm$^{-3}$ in order to reduce the contact resistance between the source electrode 12 and the first and second source regions 28a and 28b.

The depth of the first source region 28a and the second source region 28b is less than the depth of the first p well region 26a and the second p well region 26b and is, for example, equal to or greater than 0.1 μm and equal to or less than 0.4 μm.

A trench 50 is formed in the SiC layer 10 so as to extend from the first plane to the second plane of the SiC layer 10. The depth of the trench 50 is greater than the depth of the first p well region 26a and the second p well region 26b.

The gate insulating layer 16 is provided in the trench 50. The gate electrode 18 is provided on the gate insulating layer 16 in the trench 50.

At least a portion of the gate electrode 18 is located between the first p well region 26a and the second p well region 26b. At least a portion of the gate insulating layer 16 is provided between the first p well region 26a and the gate electrode 18. At least a portion of the gate insulating layer 16 is provided between the second p well region 26b and the gate electrode 18.

The gate insulating layer 16 includes, for example, silicon oxide or silicon oxynitride. The gate insulating layer 16 is, for example, a silicon oxide film. The thickness of the gate insulating layer 16 is, for example, equal to or greater than 40 nm and equal to or less than 100 nm.

The gate electrode 18 is made of, for example, polysilicon including n-type impurities or p-type impurities.

The first contact region 34a and the second contact region 34b are provided so as to come into contact with the first plane. The first source region 28a is interposed between the first contact region 34a and the gate insulating layer 16. The second source region 28b is interposed between the second contact region 34b and the gate insulating layer 16.

The first contact region 34a and the second contact region 34b are made of p$^+$ SiC. The first contact region 34a and the second contact region 34b include, for example, aluminum (Al) as p-type impurities.

The p-type impurity concentration of the first contact region 34a and the second contact region 34b is higher than the p-type impurity concentration of the first p well region 26a and the second p well region 26b. The p-type impurity concentration of the first contact region 34a and the second contact region 34b is, for example, equal to or greater than $1\times10^{18}$ cm$^{-3}$ and equal to or less than $1\times10^{21}$ cm$^{-3}$.

The depth of the first contact region 34a and the second contact region 34b is less than the depth of the first p well region 26a and the second p well region 26b and is, for example, equal to or greater than 0.1 μm and equal to or less than 0.4 μm.

The first high-concentration p region 32a is located between the drift region 24 and the first p well region 26a. The first p well region 26a is interposed between the first high-concentration p region 32a and the gate insulating layer 16.

The second high-concentration p region 32b is located between the drift region 24 and the second p well region 26b. The second p well region 26b is interposed between the second high-concentration p region 32b and the gate insulating layer 16.

The first high-concentration p region 32a and the second high-concentration p region 32b are made of p-type SiC. The first high-concentration p region 32a and the second high-concentration p region 32b include, for example, aluminum (Al) as p-type impurities.

The p-type impurity concentration of the first high-concentration p region 32a and the second high-concentration p region 32b is higher than the p-type impurity concentration of the first p well region 26a and the second p well region 26b. The p-type impurity concentration of the first high-concentration p region 32a and the second high-concentration p region 32b is higher than the p-type impurity concentration of the first p well region 26a and the second p well region 26b by, for example, one digit or more. The p-type impurity concentration of the first high-concentration p region 32a and the second high-concentration p region 32b is, for example, equal to or greater than $5 \times 10^{16}$ cm$^{-3}$ and equal to or less than $110^{20}$ cm$^{-3}$.

The thickness of the first high-concentration p region 32a and the second high-concentration p region 32b in a depth direction is, for example, equal to or greater than 0.05 μm and equal to or less than 0.2 μm.

The distance ("T" in FIG. 1) between the first high-concentration p region 32a and the gate insulating layer 16 is, for example, equal to or greater than 0.05 μm and equal to or less than 0.7 μm. The distance between the second high-concentration p region 32b and the gate insulating layer 16 is, for example, equal to or greater than 0.05 μm and equal to or less than 0.7 μm.

The distance between the first and second high-concentration p regions 32a and 32b and the drift region 24 is, for example, equal to or less than 0.1 μm.

The boundary between the first high-concentration p region 32a and a region adjacent to the first high-concentration p region is defined as an isoconcentration line indicating concentration that is half of the maximum impurity concentration of the first high-concentration p region 32a. In addition, the boundary between the second high-concentration p region 32b and a region adjacent to the second high-concentration p region 32b is defined as an isoconcentration line indicating concentration that is half of the maximum impurity concentration of the second high-concentration p region 32b.

The interlayer insulating film 20 is provided on the gate electrode 18. The interlayer insulating film 20 is, for example, a silicon oxide film.

The source electrode 12 is provided on the front surface of the SiC layer 10. The source electrode 12 is electrically connected to the first source region 28a, the second source region 28b, the first contact region 34a, and the second contact region 34b. The source electrode 12 comes into contact with the first source region 28a, the second source region 28b, the first contact region 34a, and the second contact region 34b. The source electrode 12 has a function of applying potential to the first source region 28a, the second source region 28b, the first contact region 34a, and the second contact region 34b.

The source electrode 12 is made of metal. The metal forming the source electrode 12 has, for example, a stacked structure of titanium (Ti) and aluminum (Al). The metal forming the source electrode 12 may react with the SiC layer 10 to form metal silicide or metal carbide.

The drain electrode 14 is provided on the rear surface of the SiC layer 10. The drain electrode 14 is electrically connected to the drain region 22.

The drain electrode 14 is made of metal. The metal forming the drain electrode 14 is, for example, nickel silicide.

The concentration and distribution of impurities included in the SiC layer 10 can be measured by, for example, a secondary ion mass spectroscopy (SIMS). In addition, the relative level of impurity concentration can be determined from the level of carrier concentration which is calculated by, for example, scanning capacitance microscopy (SCM). For example, the depth of regions including impurities and the distance between the regions can be calculated by, for example, SIMS. For example, the distance between the region including impurities and the gate insulating layer can be calculated from a composite image of an SCM image and an atomic force microscope (AFM) image.

A method for manufacturing a semiconductor device according to this embodiment includes forming a first mask member on a first plane of a silicon carbide layer including a first region of a first conductivity type and having the first plane and a second plane, implanting second-conductivity-type impurity ions into the silicon carbide layer on both sides of the first mask member, using the first mask member as a mask, to form a second region of a second conductivity type, depositing a second mask member on the first plane and the first mask member, removing the second mask member on the first mask member, selectively removing the first mask member with respect to the second mask member, forming a third mask member on a side surface of the second mask member, forming a trench in the silicon carbide layer so as to be separated from the second region, using the second mask member and the third mask member as a mask, forming a gate insulating layer in the trench, and forming a gate electrode on the gate insulating layer in the trench.

Hereinafter, an example of the semiconductor device manufacturing method according to this embodiment will be described. FIGS. 2 to 11 are cross-sectional views schematically illustrating the semiconductor device which is being manufactured in the semiconductor device manufacturing method according to this embodiment.

First, an n-type SiC substrate having a first plane which is a silicon face and a second plane which is a carbon face is prepared. The SiC substrate becomes the drain region 22. The n-type SiC substrate is made of 4H—SiC.

Figure 2:
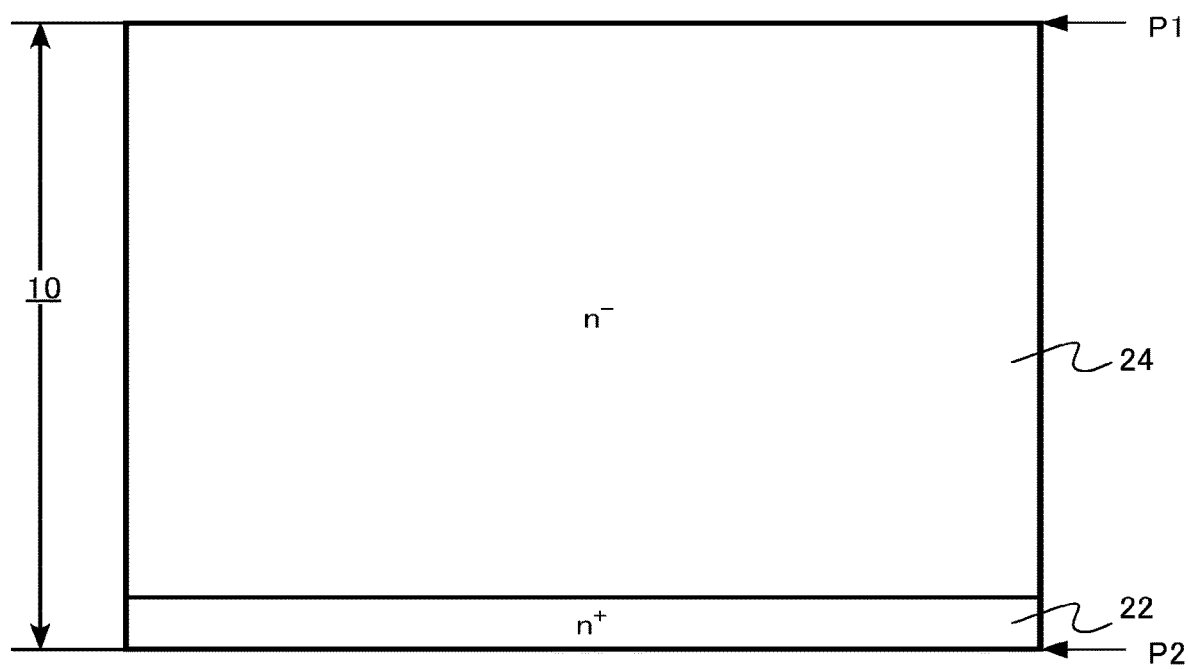
FIG. 2 is a cross-sectional view schematically illustrating the semiconductor device that is being manufactured in a semiconductor device manufacturing method according to the first embodiment.

Then, the n⁻ drift region (first region) 24 is formed on the first plane of the n-type SiC substrate by an epitaxial growth method (FIG. 2). The SiC substrate and the n⁻ drift region 24 form the SiC layer 10.

Then, aluminum (Al) ions which are p-type impurity ions are selectively implanted into the drift region 24 by photolithography and an ion implantation method. The p-type p well region (third region) 26 is formed by the ion implantation.

Then, aluminum (Al) ions which are p-type impurity ions are selectively implanted into the p well region 26 by photolithography and the ion implantation method. The first contact region 34a and the second contact region 34b are formed by the ion implantation.

Figure 3:
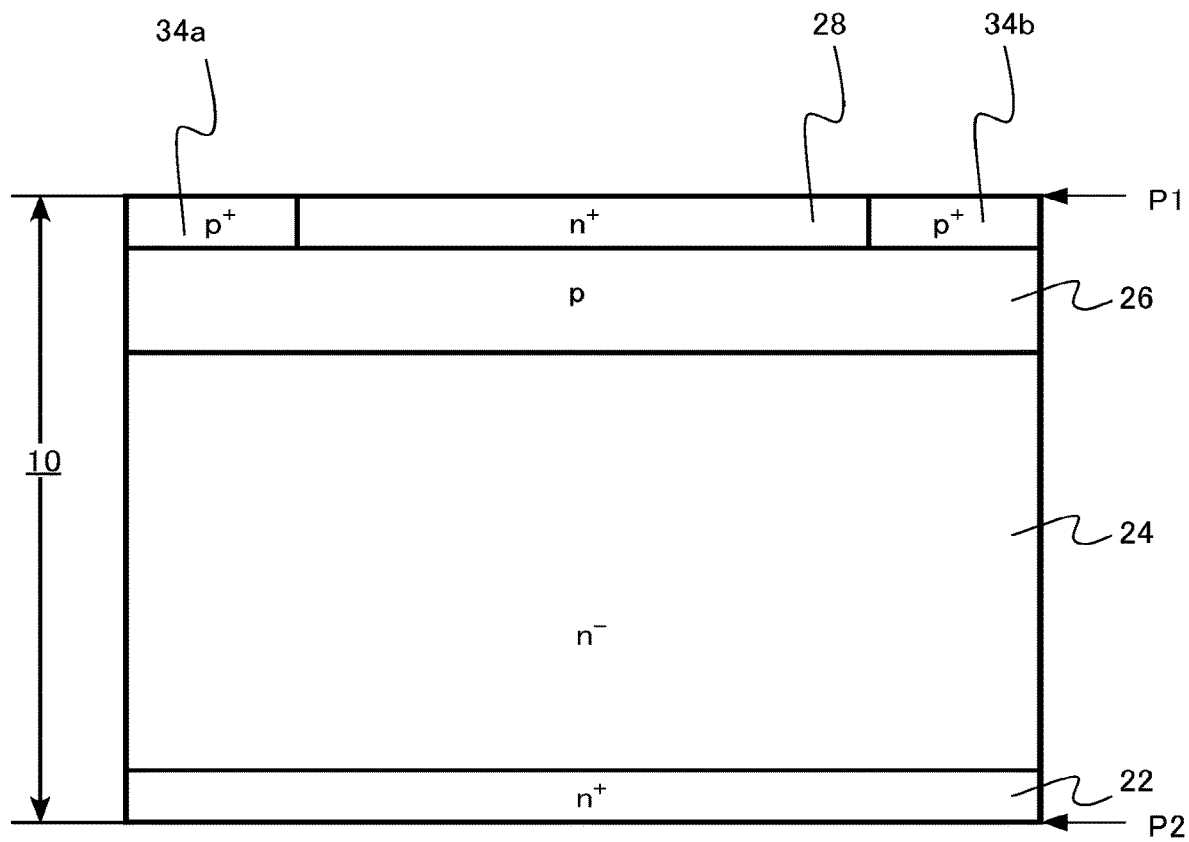
FIG. 3 is a cross-sectional view schematically illustrating the semiconductor device that is being manufactured in the semiconductor device manufacturing method according to the first embodiment.

Then, nitrogen (N) ions which are n-type impurity ions are selectively implanted into the p well region 26 by photolithography and the ion implantation method. The n⁺ source region (fourth region) 28 is formed by the ion implantation (FIG. 3).

Then, a first mask member 60 is formed on the first plane. The first mask member 60 is formed by, for example, the deposition of a film by a vapor phase growth method, lithography, and dry etching. The first mask member 60 is, for example, a silicon oxide film.

Figure 4:
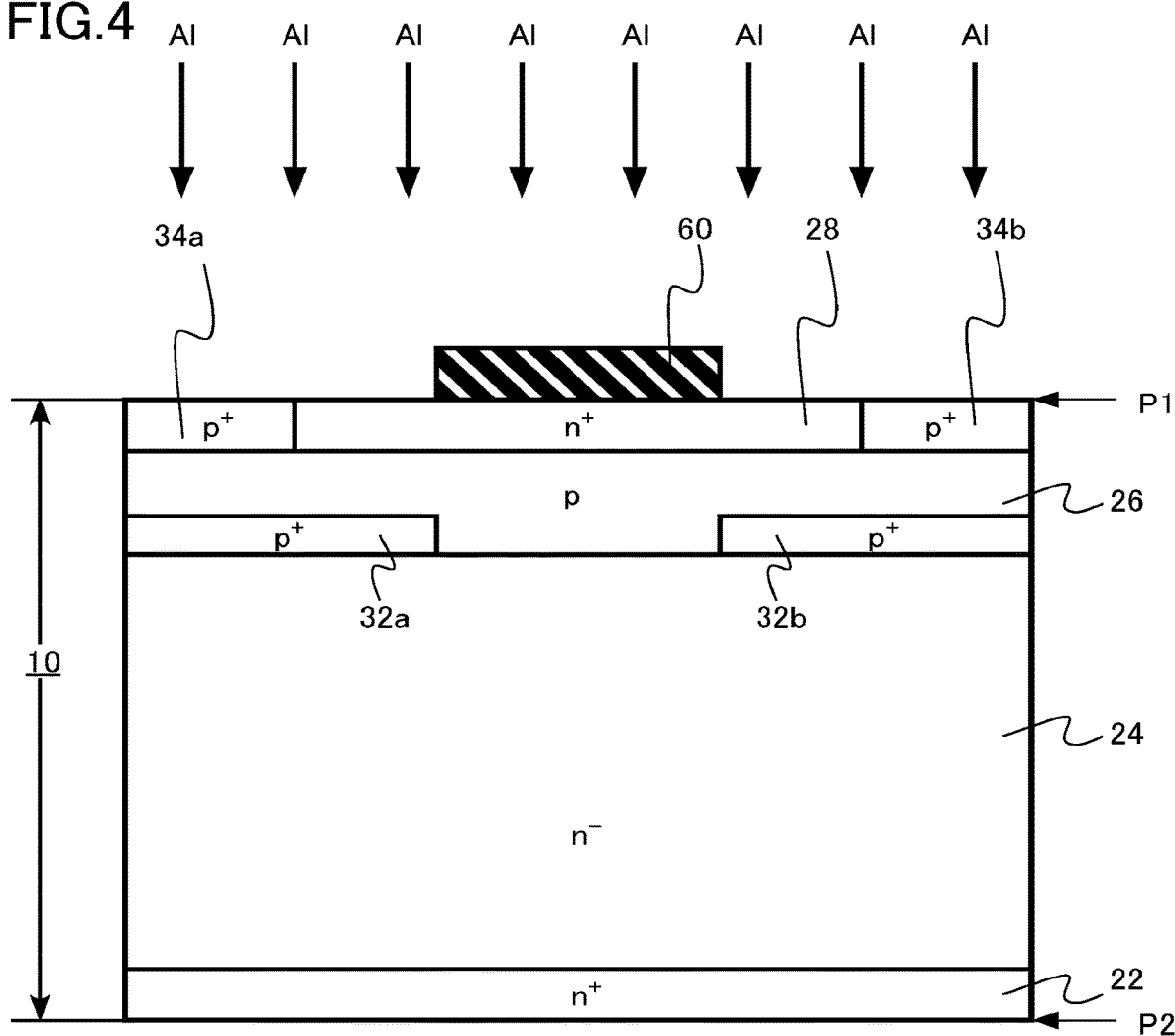
FIG. 4 is a cross-sectional view schematically illustrating the semiconductor device that is being manufactured in the semiconductor device manufacturing method according to the first embodiment.

Then, aluminum ions which are p-type impurity ions are selectively implanted into the SiC layer 10, using the first mask member 60 as a mask. The p-type first high-concentration p region (second region) 32a and the p-type second high-concentration p region (second region) 32b are formed in the SiC layer 10 on both sides of the first mask member 60 (FIG. 4).

Figure 5:
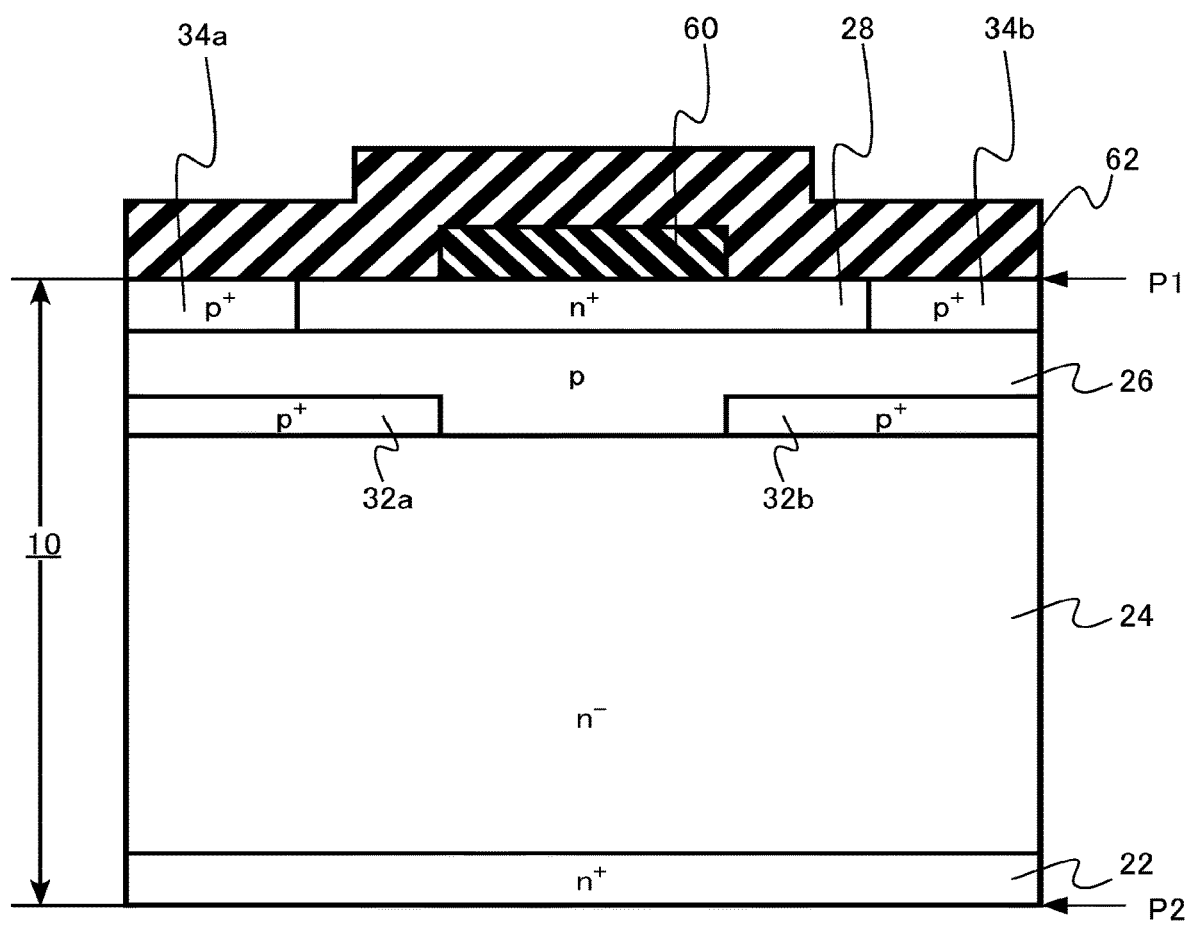
FIG. 5 is a cross-sectional view schematically illustrating the semiconductor device that is being manufactured in the semiconductor device manufacturing method according to the first embodiment.

Then, a second mask member 62 is deposited on the first plane and the first mask member 60 (FIG. 5). The second mask member 62 is formed by, for example, the deposition of a film by the vapor phase growth method. The second mask member 62 is, for example, a silicon nitride film.

Figure 6:
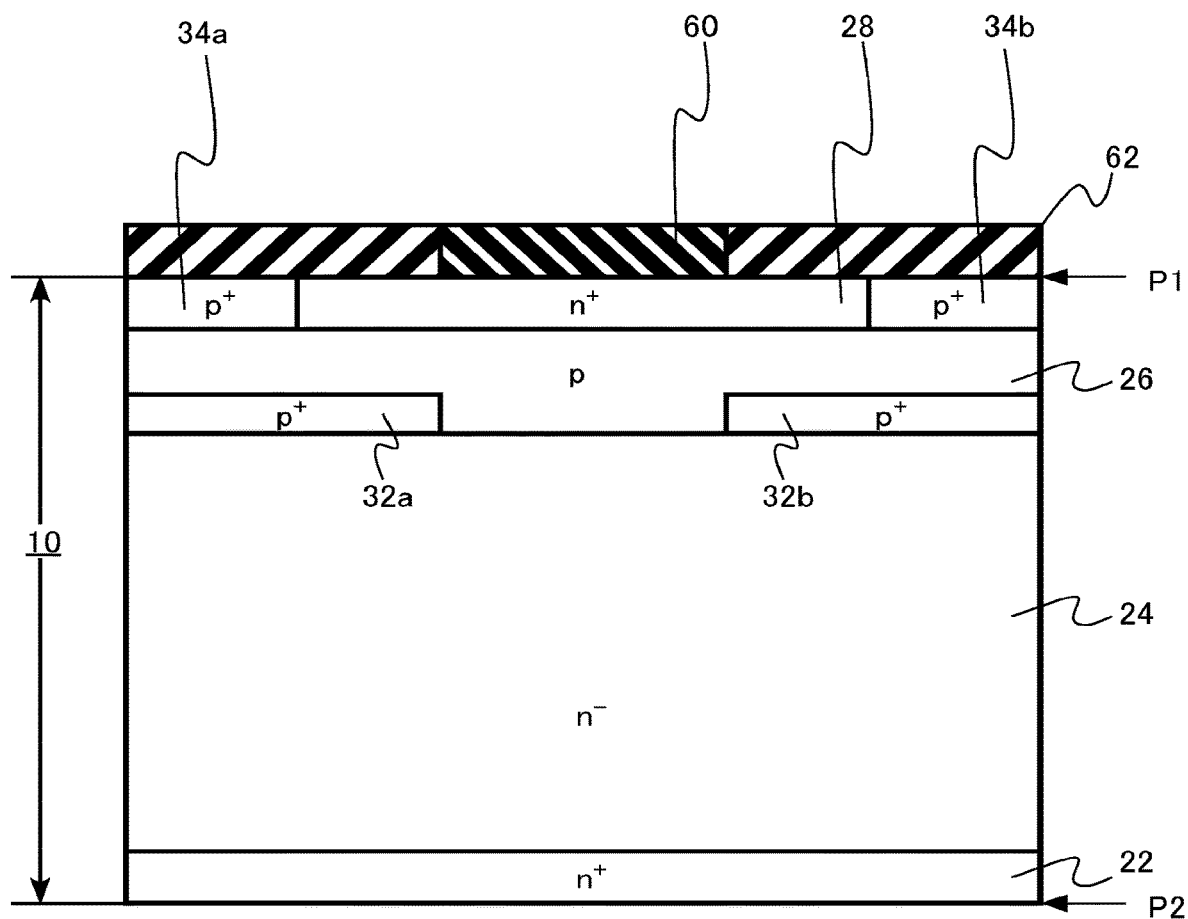
FIG. 6 is a cross-sectional view schematically illustrating the semiconductor device that is being manufactured in the semiconductor device manufacturing method according to the first embodiment.

Then, the second mask member 62 on the first mask member 60 is removed (FIG. 6). The second mask member 62 on the first mask member 60 is selectively removed by, for example, a chemical mechanical polishing (CMP) method, using the first mask member 60 as a stopper.

Figure 7:
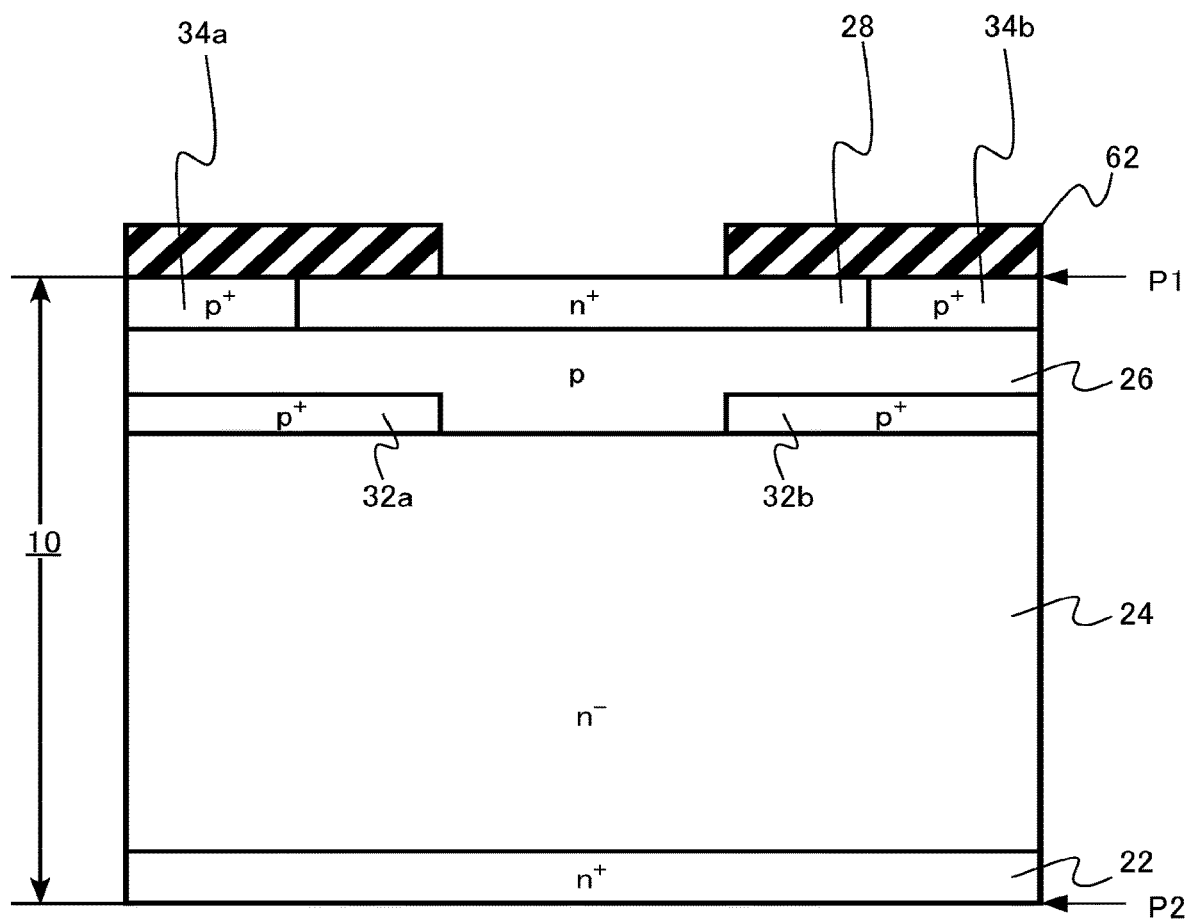
FIG. 7 is a cross-sectional view schematically illustrating the semiconductor device that is being manufactured in the semiconductor device manufacturing method according to the first embodiment.

Then, the first mask member 60 is selectively removed with respect to the second mask member 62 (FIG. 7). The first mask member 60 is removed by, for example, wet etching.

Figure 8:
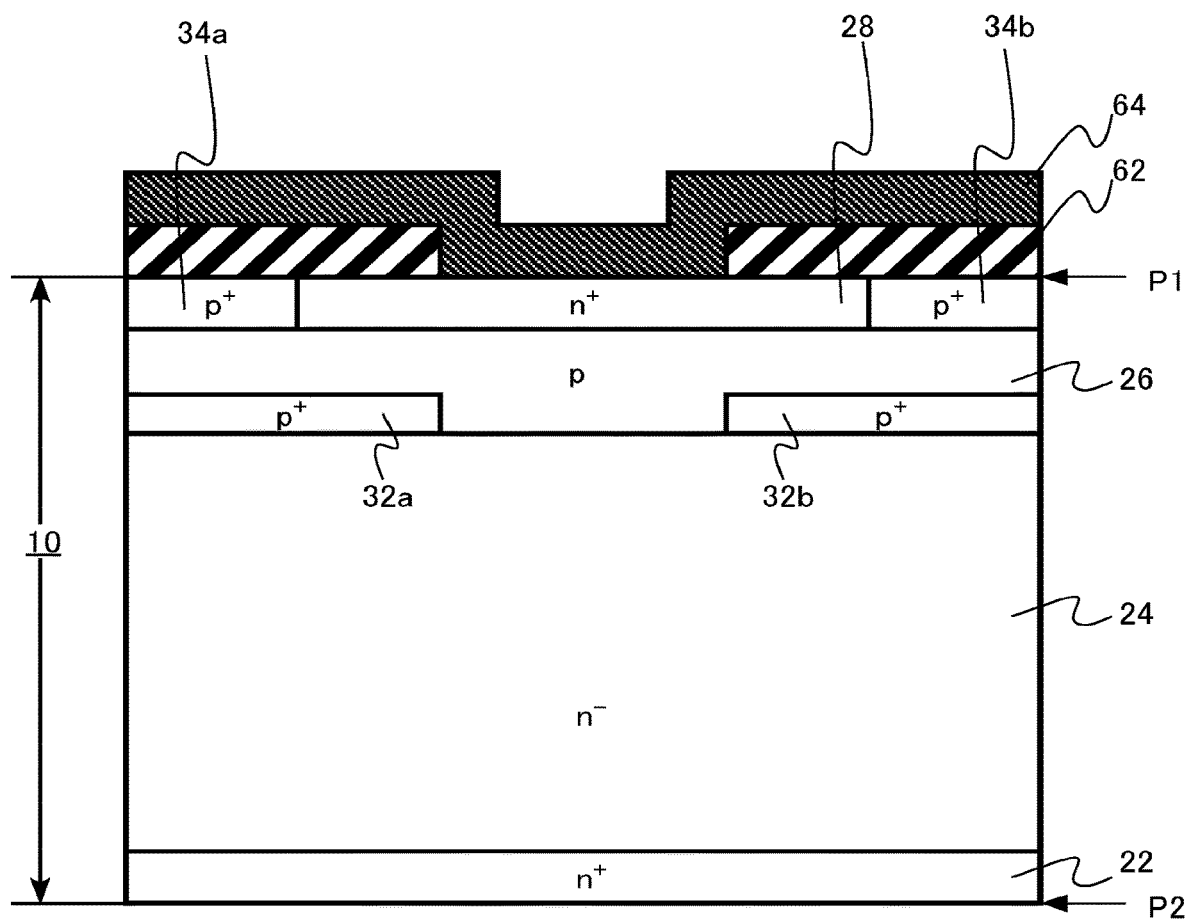
FIG. 8 is a cross-sectional view schematically illustrating the semiconductor device that is being manufactured in the semiconductor device manufacturing method according to the first embodiment.

Then, a third mask member 64 is deposited on the first plane and the second mask member 62 (FIG. 8). The third mask member 64 is formed by, for example, the deposition of a film by the vapor phase growth method. The third mask member 64 is, for example, a silicon nitride film.

Figure 9:
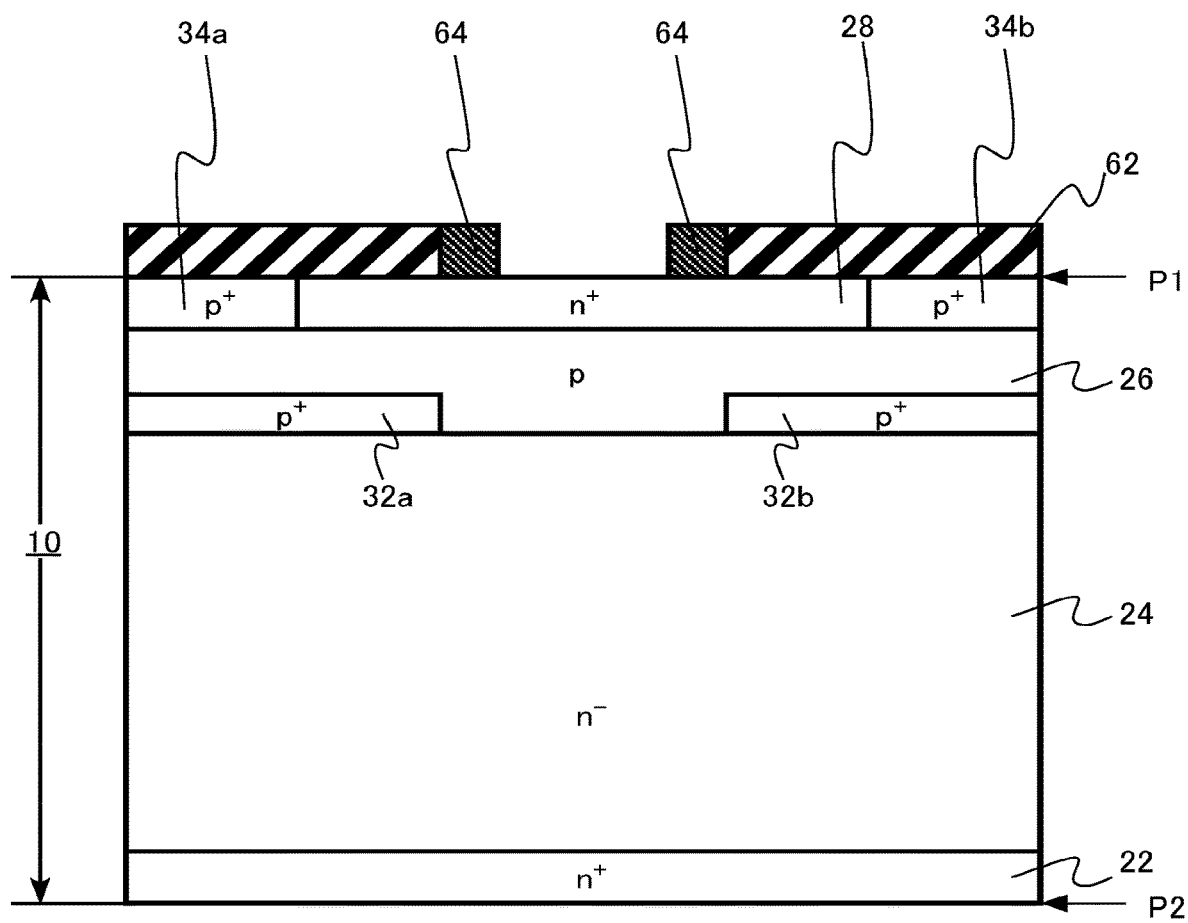
FIG. 9 is a cross-sectional view schematically illustrating the semiconductor device that is being manufactured in the semiconductor device manufacturing method according to the first embodiment.

Then, a portion of the third mask member 64 on the second mask member 62 is removed and a portion of the third mask member 64 on both sides of the second mask member 62 remains (FIG. 9). The third mask member 64 is processed by, dry etching with high anisotropy such that only a portion of the third mask member 64 placed on the side surface of the second mask member 62 remains.

Figure 10:
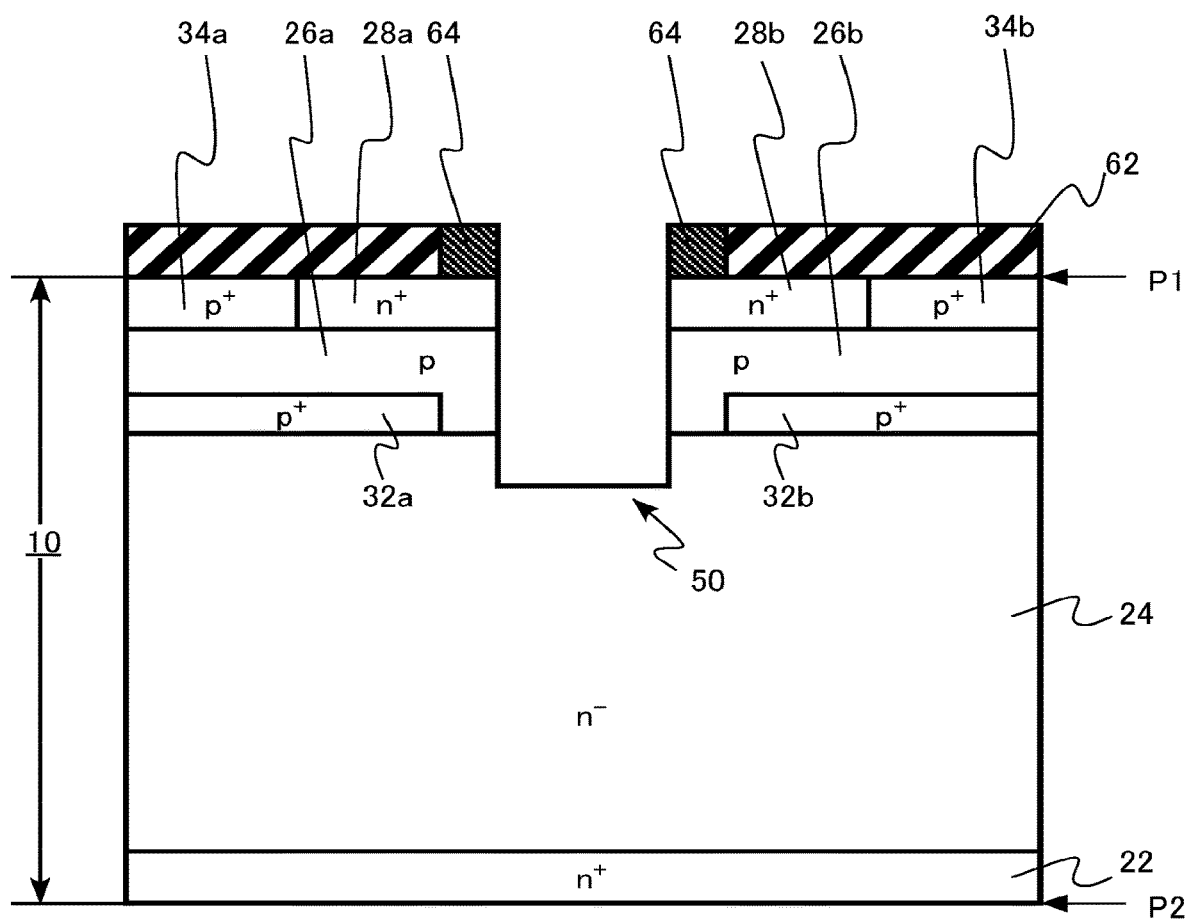
FIG. 10 is a cross-sectional view schematically illustrating the semiconductor device that is being manufactured in the semiconductor device manufacturing method according to the first embodiment.

Then, the trench 50 is formed in the SiC layer 10, using the second mask member 62 and the third mask member 64 as a mask (FIG. 10). The trench 50 is formed such that the first high-concentration p region 32a and the second high-concentration p region 32b are separated from each other. The trench 50 is formed so as to be self-aligned with the first high-concentration p region 32a and the second high-concentration p region 32b.

The p well region (third region) 26 is divided into the first p well region 26a and the second p well region 26b by the trench 50. The source region (fourth region) 28 is divided into the first source region 28a and the second source region 28b by the trench 50.

Then, a heat treatment is performed to activate the p-type impurities and the n-type impurities introduced into the SiC layer 10 by ion implantation. The heat treatment is performed, for example, in a non-oxidizing atmosphere.

Figure 11:
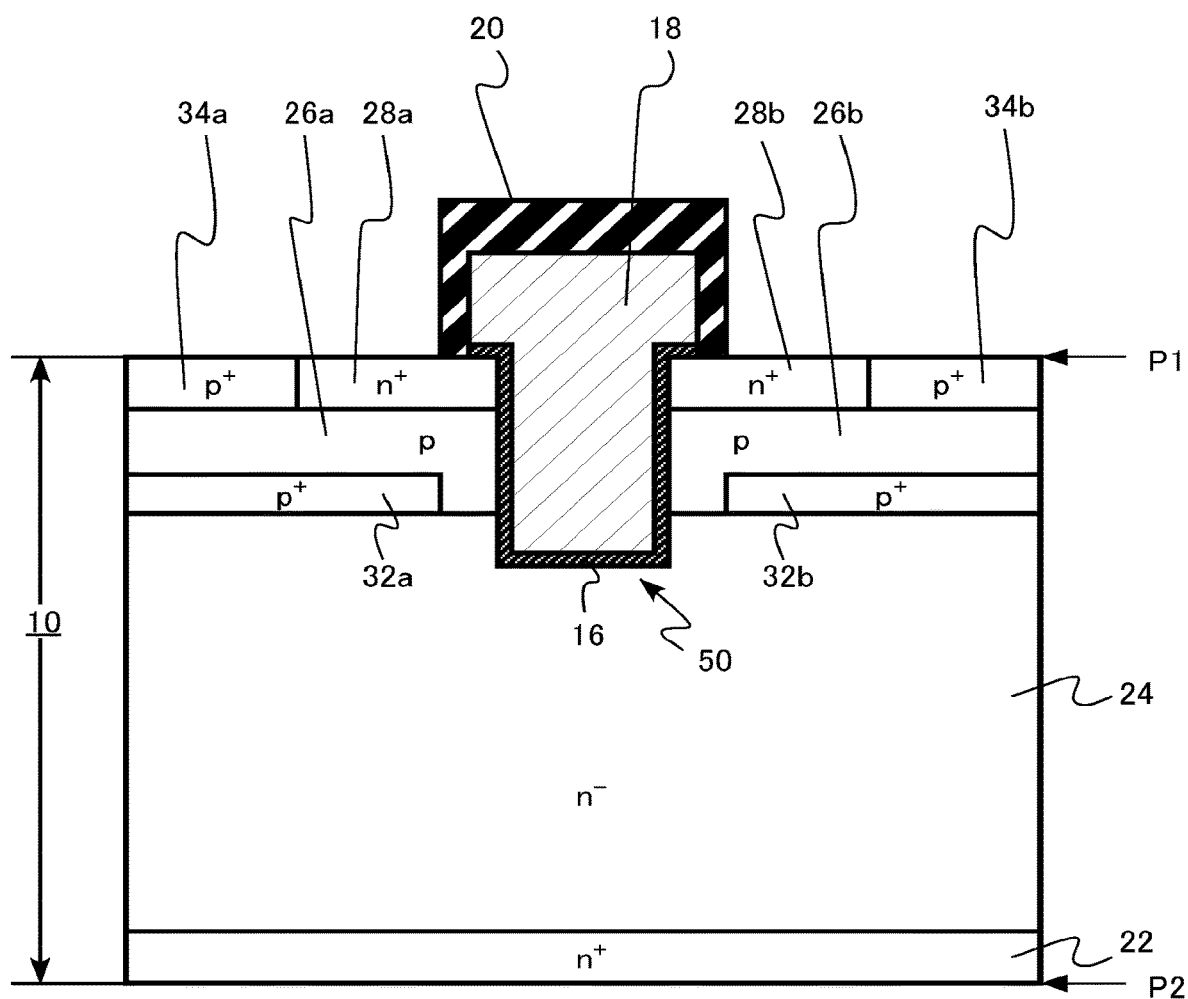
FIG. 11 is a cross-sectional view schematically illustrating the semiconductor device that is being manufactured in the semiconductor device manufacturing method according to the first embodiment.

Then, the second mask member 62 and the third mask member 64 are removed. Then, the gate insulating layer 16, the gate electrode 18, and the interlayer insulating film 20 are formed by a known processing technique (FIG. 11).

Then, the source electrode 12 is formed on the front surface of the SiC layer 10 by a known processing technique. In addition, the drain electrode 14 is formed on the rear surface of the SiC layer 10.

The MOSFET 100 illustrated in FIG. 1 is formed by the above-mentioned manufacturing method.

Next, the function and effect of the semiconductor device according to this embodiment will be described. FIGS. 12A to 17B are diagrams illustrating the function and effect of the semiconductor device according to this embodiment.

The trench gate MOSFET has the problem that, in the off state of the MOSFET, the breakdown voltage of a gate insulating film is reduced due to the concentration of the electric field on the bottom of a trench. In particular, the breakdown voltage of the gate insulating film is reduced due to the concentration of the electric field on the corners of the trench, which results in a reduction in the breakdown voltage of the MOSFET.

The MOSFET 100 according to this embodiment includes the first high-concentration p region (sixth silicon carbide region) 32a and the second high-concentration p region (seventh silicon carbide region) 32b. Therefore, the concentration of the electric field on the corners of the trench is reduced. As a result, the maximum electric field strength of the gate insulating layer 16 is reduced.

In the MOSFET 100, the first p well region 26a and the second p well region 26b, the first source region 28a and the second source region 28b, the first high-concentration p region 32a and the second high-concentration p region 32b, and the first contact region 34a and the second contact region 34b are symmetrically provided with the trench 50 interposed therebetween. Therefore, the pairs of regions have the same structure and function. In the following description, the first p well region 26a and the second p well region 26b are simply referred to as a "p well region", the first source region 28a and the second source region 28b are simply referred to as a "source region", the first high-concentration p region 32a and the second high-concentration p region 32b are simply referred to as a "high-concentration p region", and the first contact region 34a and the second contact region 34b are simply referred to as a "contact region".

Figure 12A:
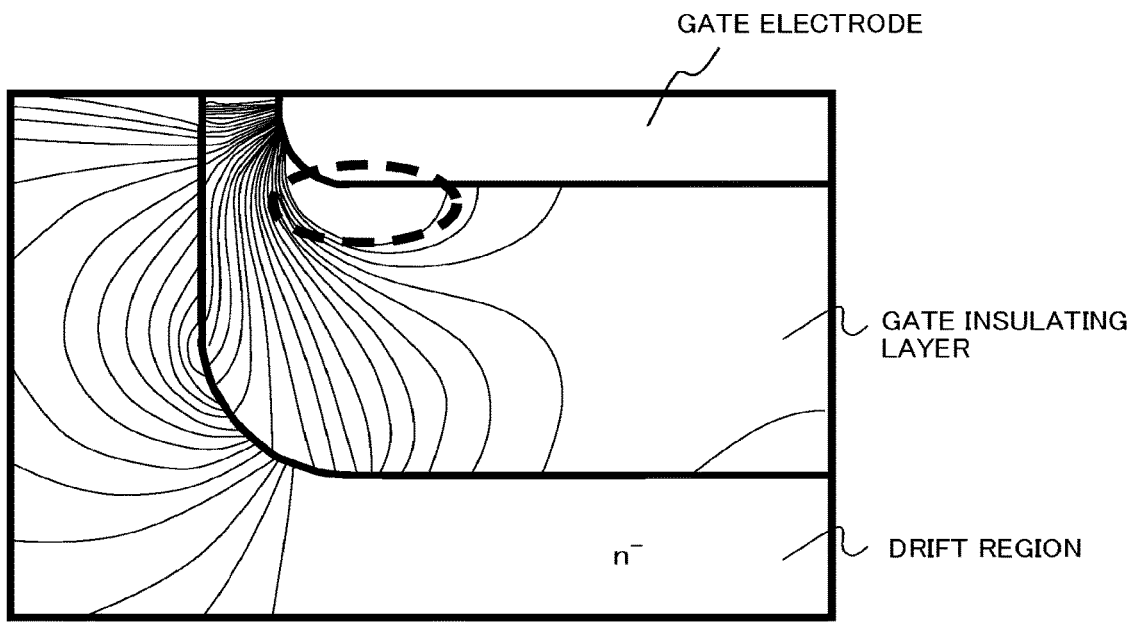
FIGS. 12A and 12B are diagrams illustrating the function and effect of the semiconductor device according to the first embodiment.
Figure 12B:
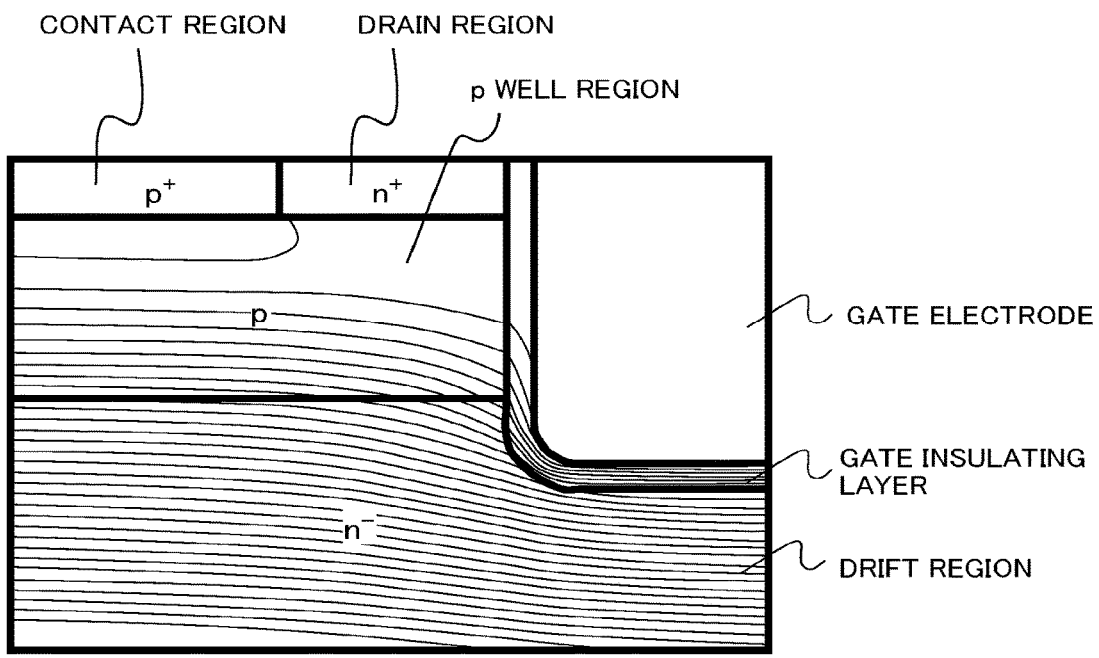

FIGS. 12A and 12B are diagrams illustrating the simulation results of the electric field strength distribution and the potential distribution of a MOSFET without a high-concentration p region when the MOSFET is turned off. In FIG. 12A, the electric field strength distribution is represented by an equi-field-strength line. In FIG. 12B, the potential distribution is represented by an equipotential line. In FIGS. 12A and 12B, the corner of the trench is enlarged.

As illustrated in FIG. 12A, when the MOSFET is turned off, the maximum electric field strength is generated in the gate insulating layer (a region surrounded by a dashed line in FIG. 12A) at the corner of the trench. As illustrated in FIG. 12B, when the MOSFET is turned off, a large number of equipotential lines extend from the drift region to the p well region. In other words, the amount of shift of the position where potential is 0 V to the front surface is large in the p well region and the position where potential is 0 V is separated from the position of the gate electrode at the bottom of the trench where potential is 0 V in the vertical direction.

Therefore, as can be seen from FIG. 12B, the interval between the equipotential lines is very small in the gate insulating layer at the corner of the trench. In other words, a large number of equipotential lines extend into the well region. Therefore, the electric field is concentrated on the gate insulating layer at the corner of the trench and electric field strength increases.

Figure 13A:
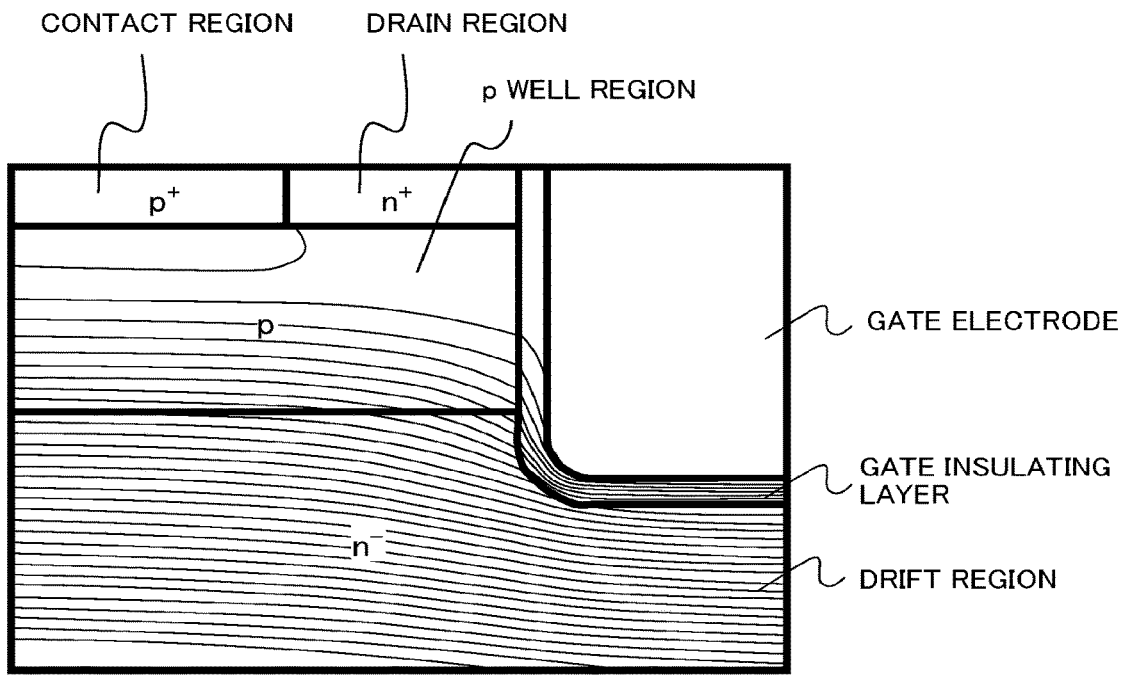
FIGS. 13A and 13B are diagrams illustrating the function and effect of the semiconductor device according to the first embodiment.
Figure 13B:
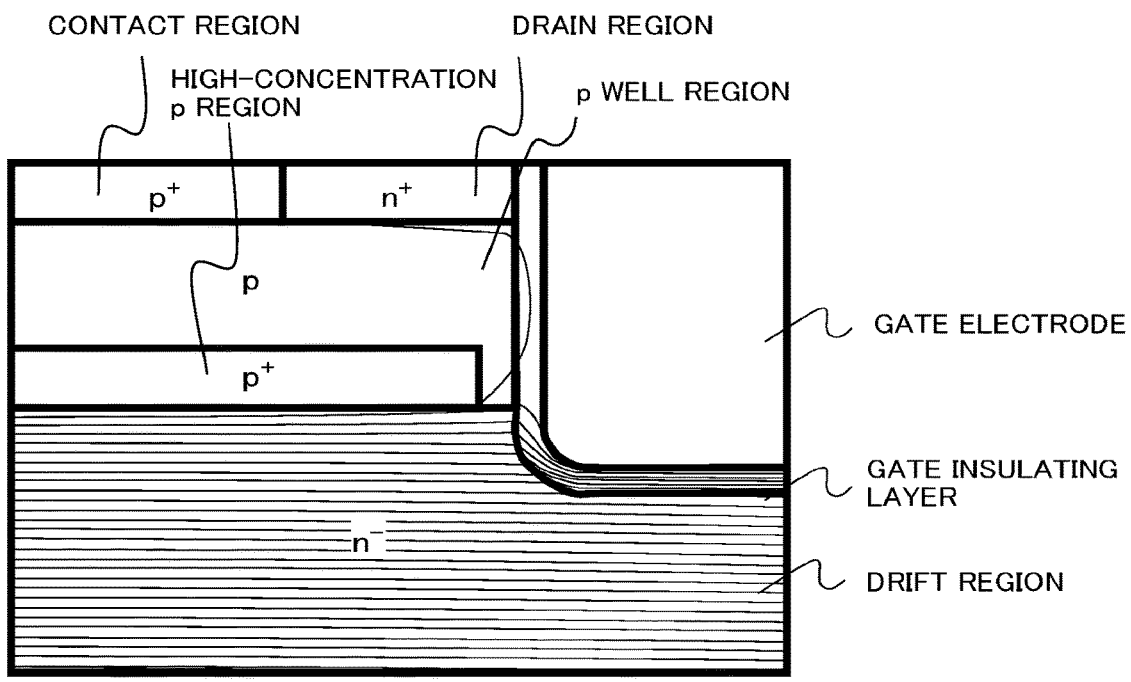

FIGS. 13A and 13B are diagrams illustrating the simulation results of the potential distribution of the MOSFET 100 according to this embodiment when the MOSFET 100 is turned off. FIG. 13A illustrates the potential distribution of a MOSFET without a high-concentration p region for comparison. FIG. 13A is the same as FIG. 12B.

FIG. 13B illustrates the potential distribution of the MOSFET 100 according to this embodiment. As can be seen from the comparison between FIG. 13A and FIG. 13B, since the high-concentration p region is provided in the MOSFET 100, the extension of the equipotential lines from the drift region to the p well region is substantially completely prevented. Therefore, the interval between the equipotential lines in the gate insulating layer at the corner of the trench is less than that in FIG. 13B.

Figure 14A:
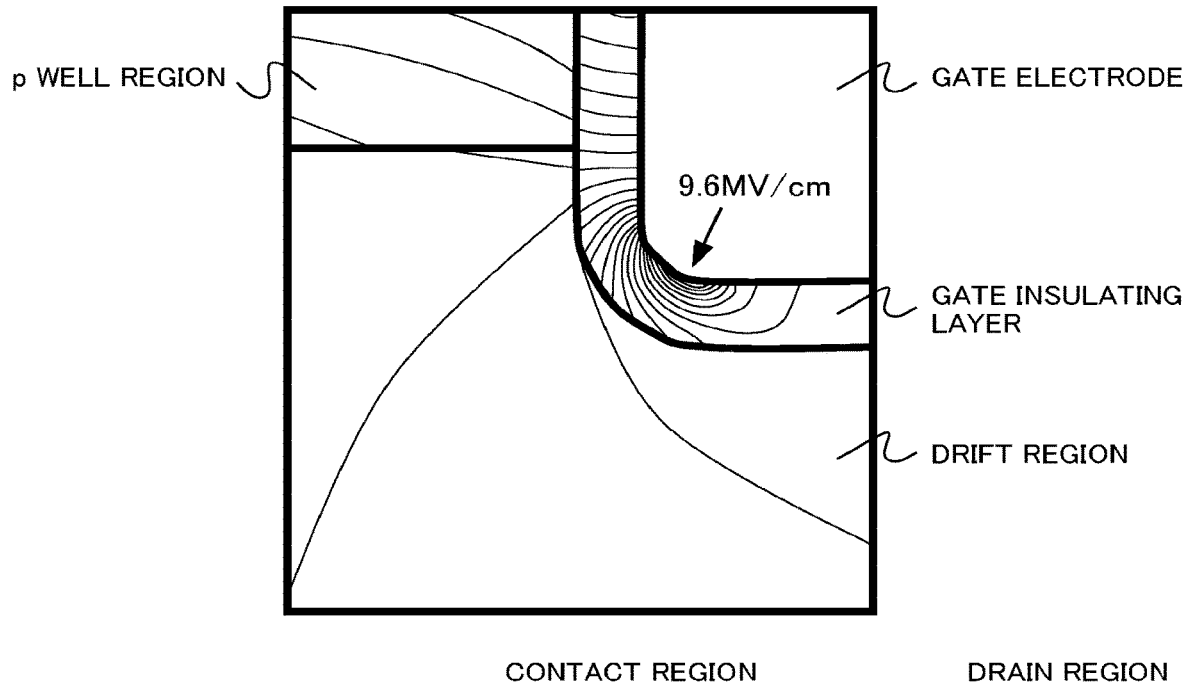
FIGS. 14A and 14B are diagrams illustrating the function and effect of the semiconductor device according to the first embodiment.
Figure 14B:
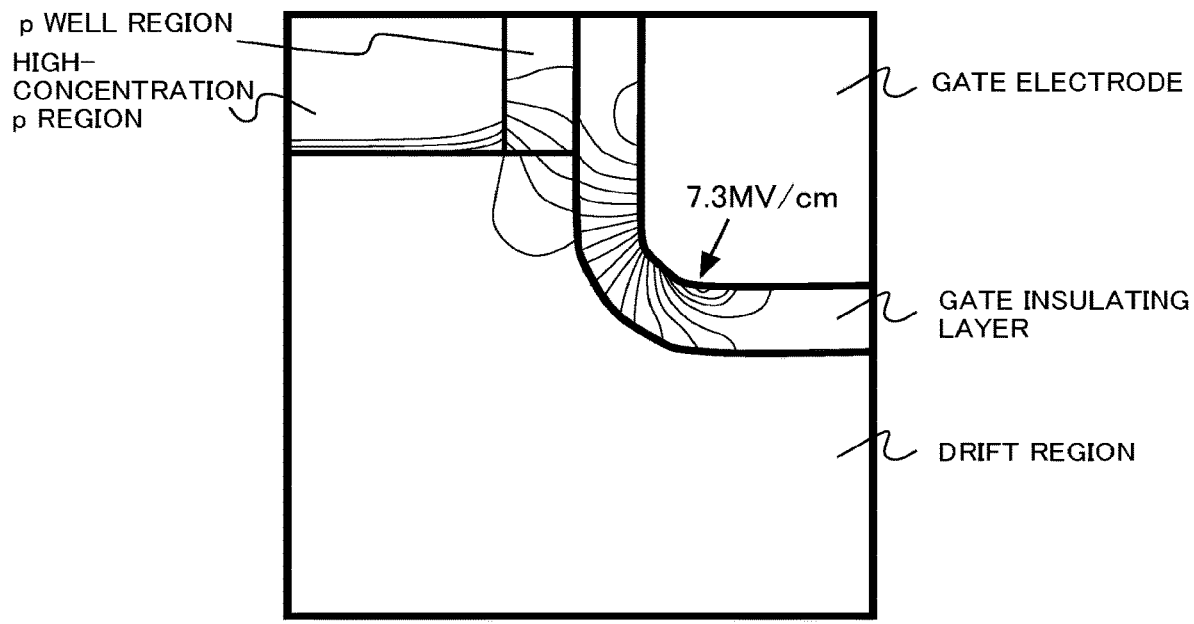

FIGS. 14A and 14B are diagrams illustrating the simulation results of the electric field strength distribution of the MOSFET 100 according to this embodiment when the MOSFET 100 is turned off. FIG. 14A illustrates the electric field strength distribution of a MOSFET without a high-concentration p region for comparison. FIG. 14B illustrates the electric field strength distribution of the MOSFET 100 according to this embodiment.

In the MOSFET without a high-concentration p region, the maximum electric field strength of the gate insulating layer is 9.6 MV/cm. In contrast, in the MOSFET 100 according to this embodiment, the maximum electric field strength of the gate insulating layer is 7.3 MV/cm. The results prove that, when the high-concentration p region is provided, the maximum electric field strength of the gate insulating layer at the corner of the trench is reduced.

Figure 15:
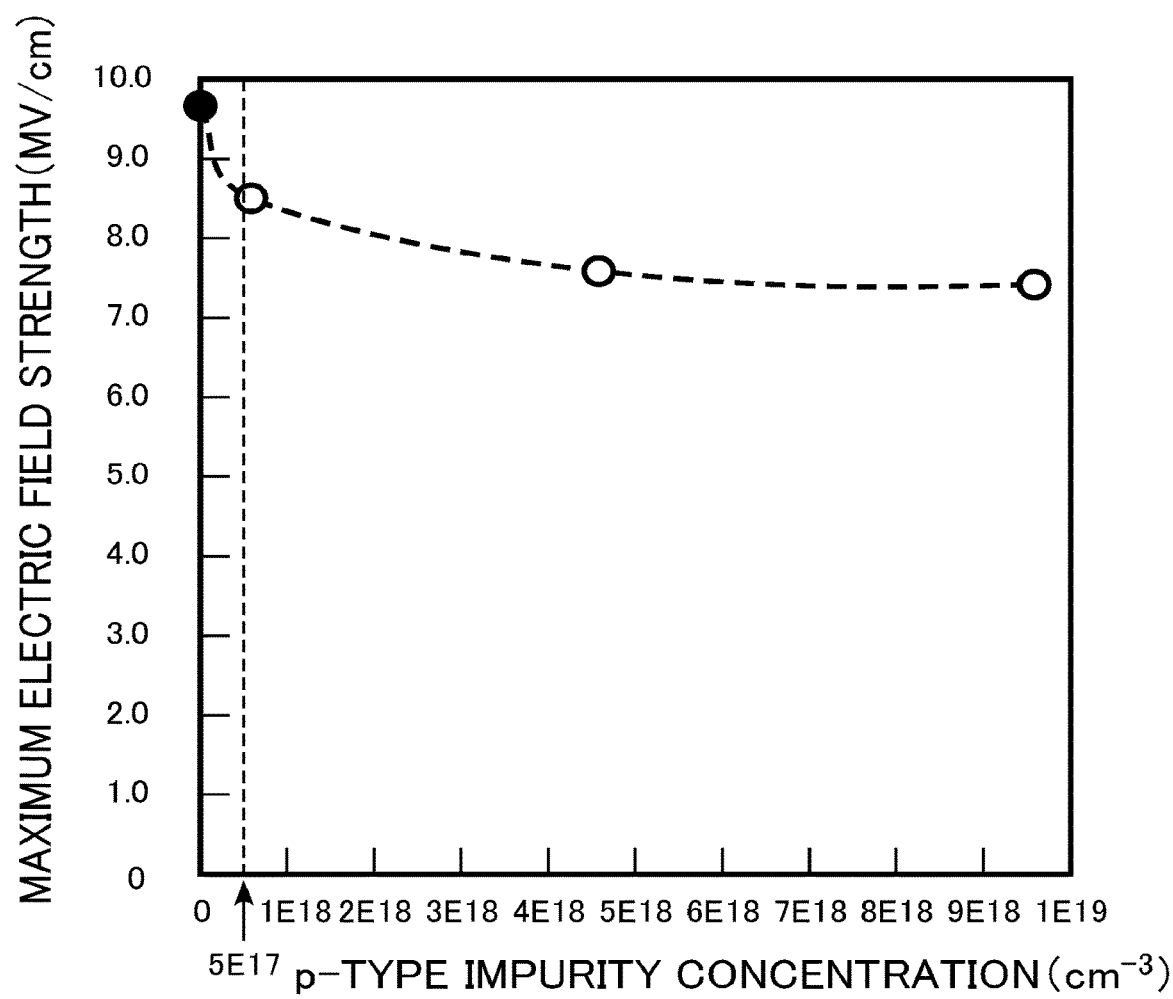
FIG. 15 is a diagram illustrating the function and effect of the semiconductor device according to the first embodiment.

FIG. 15 is a diagram illustrating the simulation results of the relationship between the p-type impurity concentration of the high-concentration p region and the maximum electric field strength of the gate insulating layer in the MOSFET 100 according to this embodiment. The p-type impurity concentration of the p well region is fixed to $1 \times 10^{17}$ cm$^{-3}$. The distance ("T" in FIG. 1) between the high-concentration p region and the gate insulating layer is fixed to 0.7 μm.

In FIG. 15, a black circle indicates the maximum electric field strength when the high-concentration p region is not provided. As can be seen from FIG. 15, the maximum electric field strength is reduced when the p-type impurity concentration of the high-concentration p region is equal to or greater than $5 \times 10^{17}$ cm$^{-3}$. Therefore, the p-type impurity concentration of the high-concentration p region is preferably equal to or greater than $5 \times 10^{17}$ cm$^{-3}$, more preferably equal to or greater than $1 \times 10^{18}$ cm$^{-3}$, and most preferably equal to or greater than $4 \times 10^{18}$ cm$^{-3}$.

The p-type impurity concentration of the first high-concentration p region 32a and the second high-concentration p region 32b is preferably higher than the p-type impurity concentration of the first p well region 26a and the second p well region 26b by one digit or more, in order to reduce the maximum electric field strength of the gate insulating layer 16.

Figure 16:
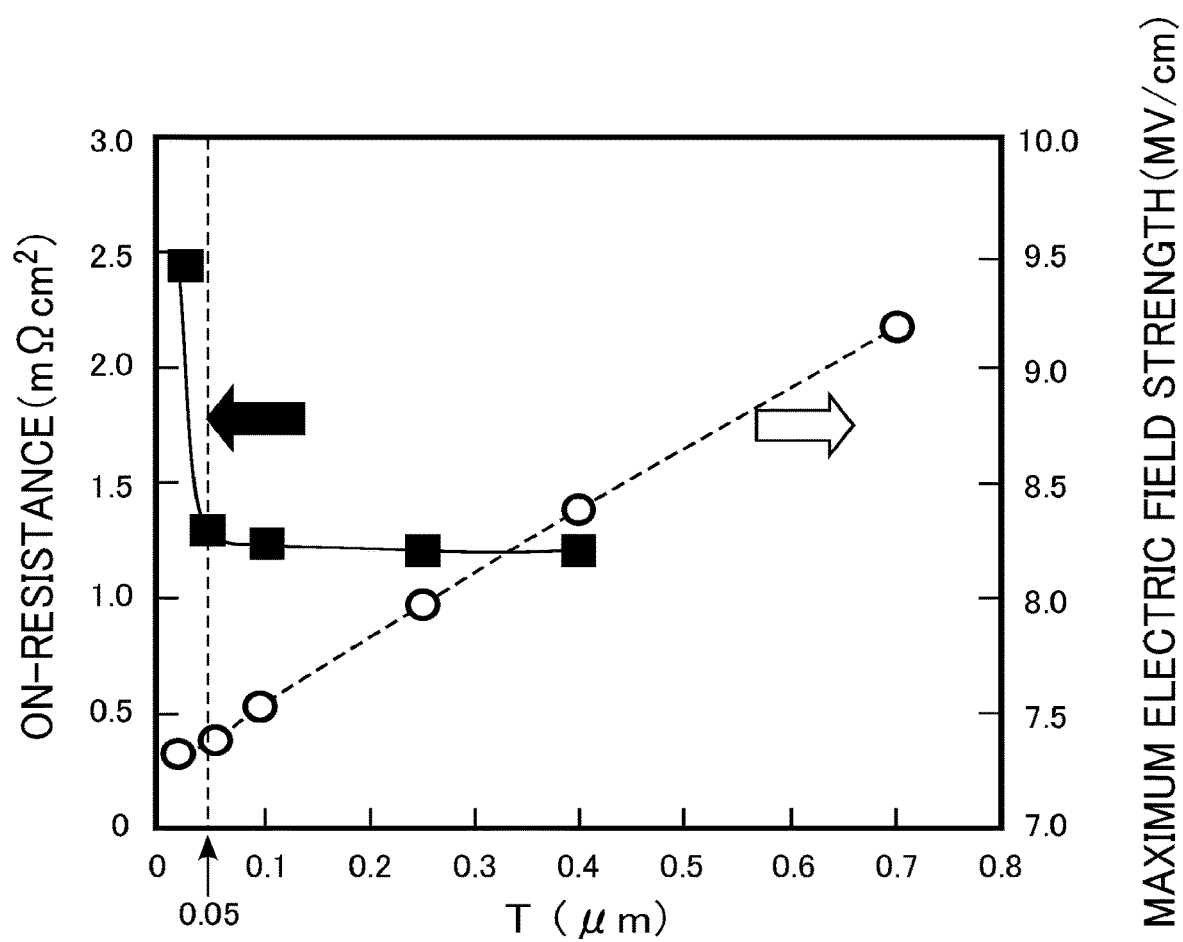
FIG. 16 is a diagram illustrating the function and effect of the semiconductor device according to the first embodiment.

FIG. 16 is a diagram illustrating the simulation results of the distance ("T" in FIG. 1) between the high-concentration p region and the gate insulating layer, on-resistance, and the maximum electric field strength in the MOSFET 100 according to this embodiment. In FIG. 16, a black rectangle indicates on-resistance and a white circle indicates the maximum electric field strength.

The p-type impurity concentration of the p well region is fixed to $1 \times 10^{17}$ cm$^{-3}$. The p-type impurity concentration of the high-concentration p region is fixed to $1 \times 10^{18}$ cm$^{-3}$.

When the high-concentration p region is not provided, on-resistance is 1.2 mΩcm$^2$. In addition, when the high-concentration p region is not provided, the maximum electric field strength is 9.6 MV/cm.

As can be seen from FIG. 16, when the distance between the high-concentration p region and the gate insulating layer decreases, on-resistance increases. The reason is that p-type impurity concentration in the vicinity of the gate insulating layer increases and the channel resistance of the MOSFET 100 increases.

When the distance between the high-concentration p region and the gate insulating layer is equal to or greater than 0.05 μm, on-resistance is reduced suddenly and is substantially equal to the value when the high-concentration p region is not provided. Therefore, the distance between the high-concentration p region and the gate insulating layer is preferably equal to or greater than 0.05 μm and more preferably equal to or greater than 0.1 μm.

As can be seen from FIG. 16, when the distance between the high-concentration p region and the gate insulating layer increases, the maximum electric field strength of the gate insulating layer increases. Then, the equipotential lines extend into the p well region between the high-concentration p region and the gate insulating layer. However, when distance between the high-concentration p region and the gate insulating layer is equal to or less than 0.7 μm, the maximum electric field strength is lower than that when the high-concentration p region is not provided. Therefore, the distance between the high-concentration p region and the gate insulating layer is preferably equal to or less than 0.7 μm and more preferably equal to or less than 0.4 μm.

Figure 17A:
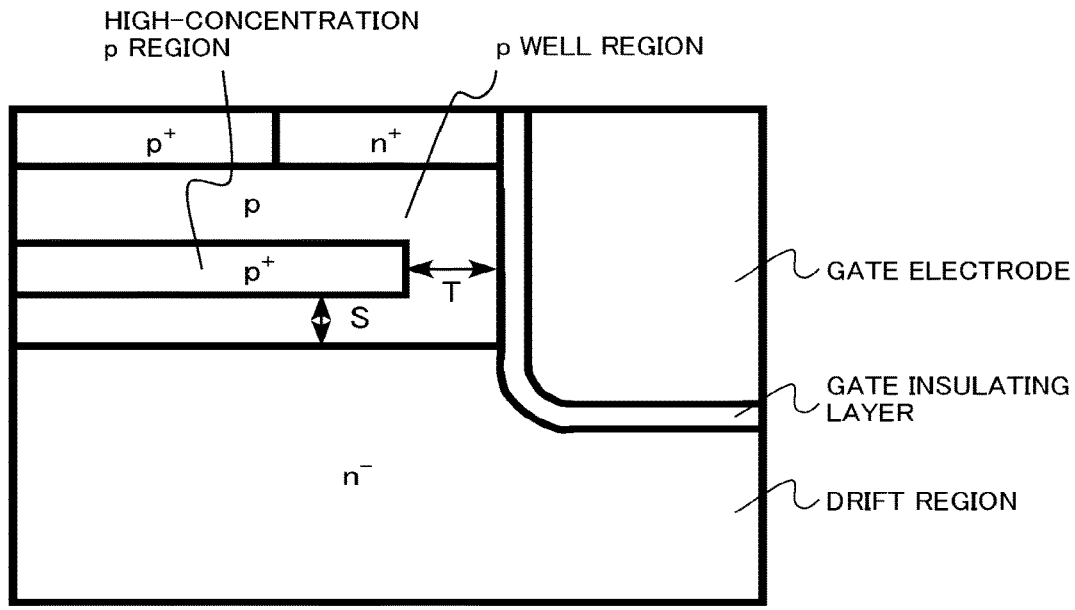
FIGS. 17A and 17B are diagrams illustrating the function and effect of the semiconductor device according to the first embodiment.
Figure 17B:
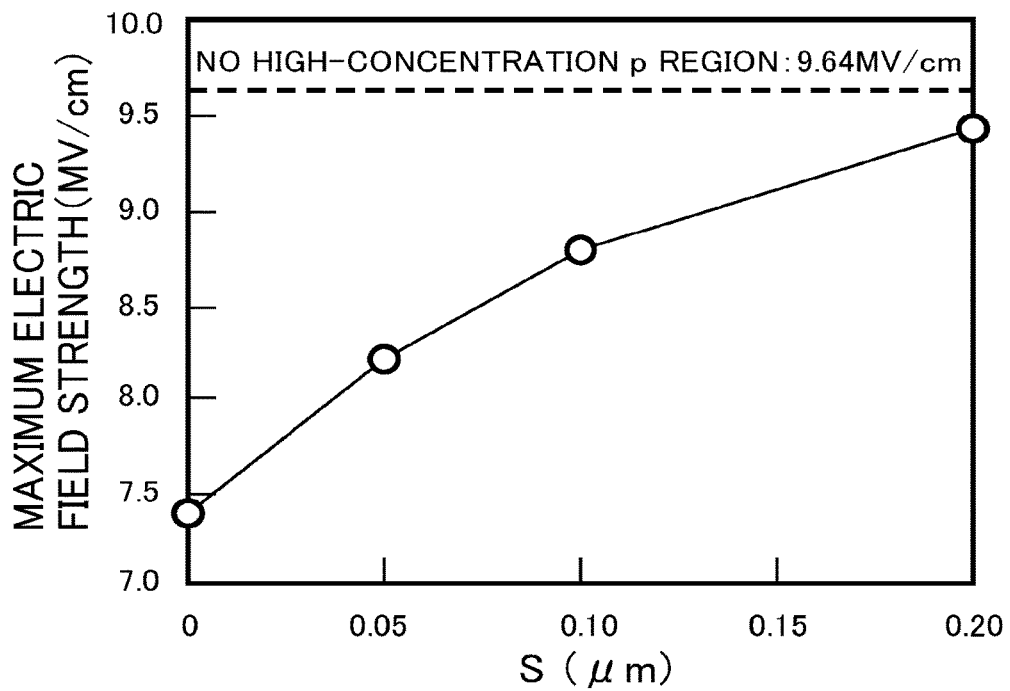

FIGS. 17A and 17B are diagrams illustrating the simulation results of the relationship between the distance between the high-concentration p region and the drift region and the maximum electric field strength of the gate insulating layer in the MOSFET 100 according to this embodiment. FIG. 17A is a diagram illustrating simulation parameters. FIG. 17B is a diagram illustrating the simulation results.

In the simulation, the p-type impurity concentration of the p well region is fixed to $1 \times 10^{17}$ cm$^{-3}$. The p-type impurity concentration of the high-concentration p region is fixed to $1 \times 10^{18}$ cm$^{-3}$. The distance ("T" in FIG. 17A) between the high-concentration p region and the gate insulating layer is fixed to 0.7 μm. The distance ("S" in FIG. 17A) between the high-concentration p region and the drift region is a variable.

As can be seen from FIG. 17B, when the distance between the high-concentration p region and the drift region increases, the maximum electric field strength of the gate insulating layer increases. This is because the maximum electric field strength is affected by the equipotential lines extending into the p well region between the high-concentration p region and the drift region.

When the distance between the high-concentration p region and the drift region is equal to or less than 0.1 μm, the maximum electric field strength is sufficiently lower than that when the high-concentration p region is not provided. Therefore, the distance between the high-concentration p region and the drift region is preferably equal to or less than 0.1 μm and more preferably equal to or less than 0.05 μm.

When the thickness of the high-concentration p region in the depth direction is too large, there is a concern that channel resistance will increase and on-resistance will be too high. Therefore, the thickness of the high-concentration p region in the depth direction is preferably equal to or less than 0.2 μm and more preferably equal to or less than 0.15 μm.

On the other hand, when the thickness of the high-concentration p region in the depth direction is too small, there is a concern that the effect of preventing the equipotential lines from extending into the p well region will be insufficient. Therefore, the thickness of the high-concentration p region in the depth direction is preferably equal to or greater than 0.05 μm and more preferably equal to or greater than 0.1 μm.

In the MOSFET 100 according to this embodiment, as described with reference to FIG. 16, when the distance ("T" in FIG. 1) between the high-concentration p region and the gate insulating layer varies, the on-resistance and the maximum electric field strength vary. Therefore, it is preferable to prevent a variation in the distance between the high-concentration p region and the gate insulating layer when the MOSFET 100 is manufactured, in order to stabilize the characteristics of the MOSFET 100.

In the method for manufacturing the MOSFET 100 according to this embodiment, the distance between the high-concentration p region and the gate insulating layer, that is, the distance between the high-concentration p region and the trench is determined in a self-alignment manner. Therefore, a variation in the distance between the high-concentration p region and the gate insulating layer is prevented. As a result, the MOSFET 100 with stable characteristics is achieved.

Figure 18:
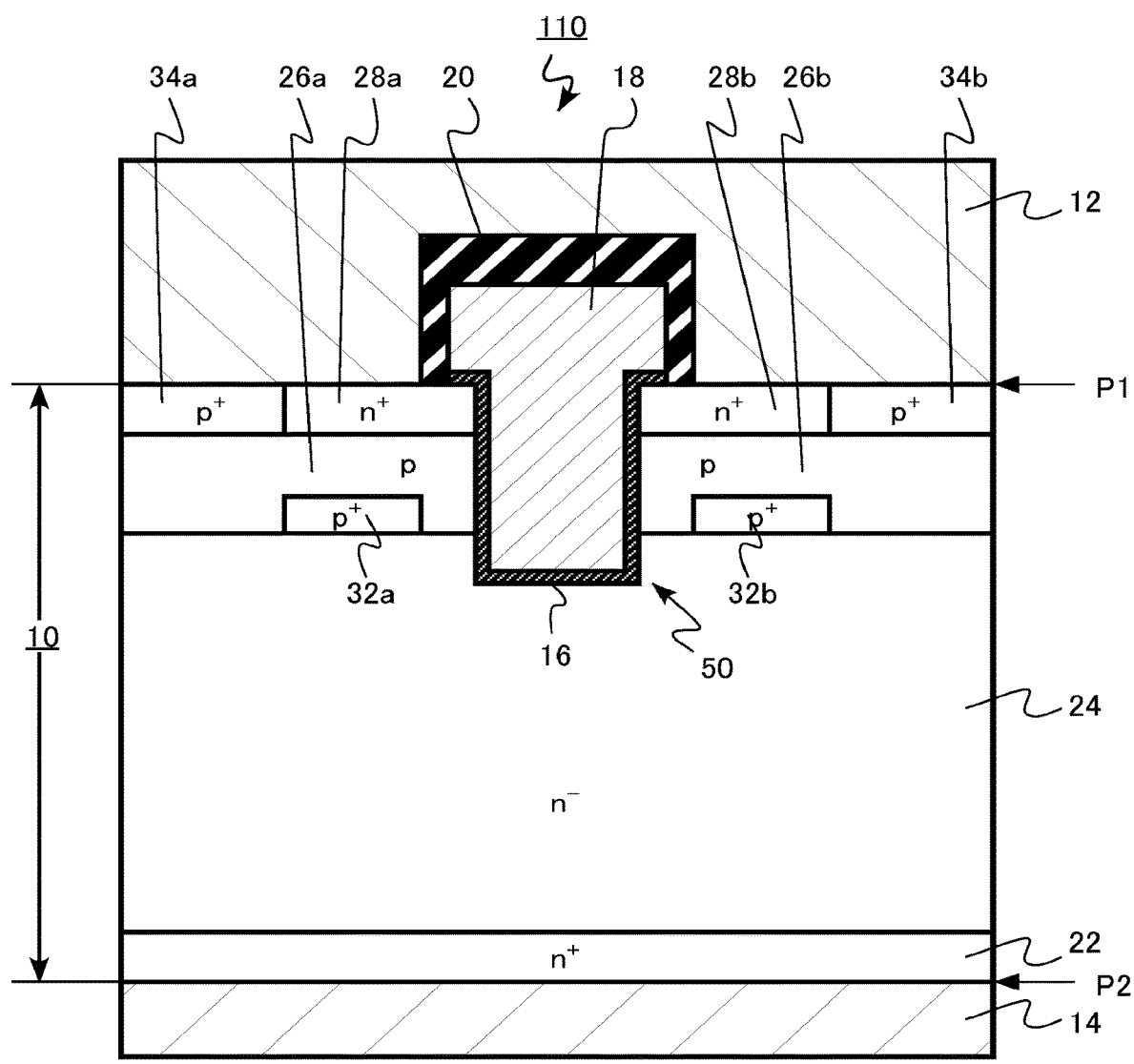
FIG. 18 is a cross-sectional view schematically illustrating a modification example of the semiconductor device according to the first embodiment.

FIG. 18 is a cross-sectional view schematically illustrating a modification example of the semiconductor device according to this embodiment. A MOSFET 110 according to the modification example differs from the MOSFET 100 in that the width of the first high-concentration p region 32a and the second high-concentration p region 32b is smaller than that in the MOSFET 100. The MOSFET 110 has the same function and effect as the MOSFET 100.

As described above, according to this embodiment, the maximum electric field strength of the gate insulating layer 16 is reduced and the MOSFET 100 that can improve the breakdown voltage of the gate insulating layer is achieved. In addition, according to this embodiment, the MOSFET 100 with stable characteristics can be manufactured.

Second Embodiment

A semiconductor device according to this embodiment is the same as the semiconductor device according to the first embodiment except that a distance between the second plane and the sixth silicon carbide region is less than a distance between the second plane and the second silicon carbide region and a distance between the second plane and a seventh silicon carbide region is less than a distance between the second plane and the third silicon carbide region. Hereinafter, the description of the same content as that in the first embodiment will not be repeated.

Figure 19:
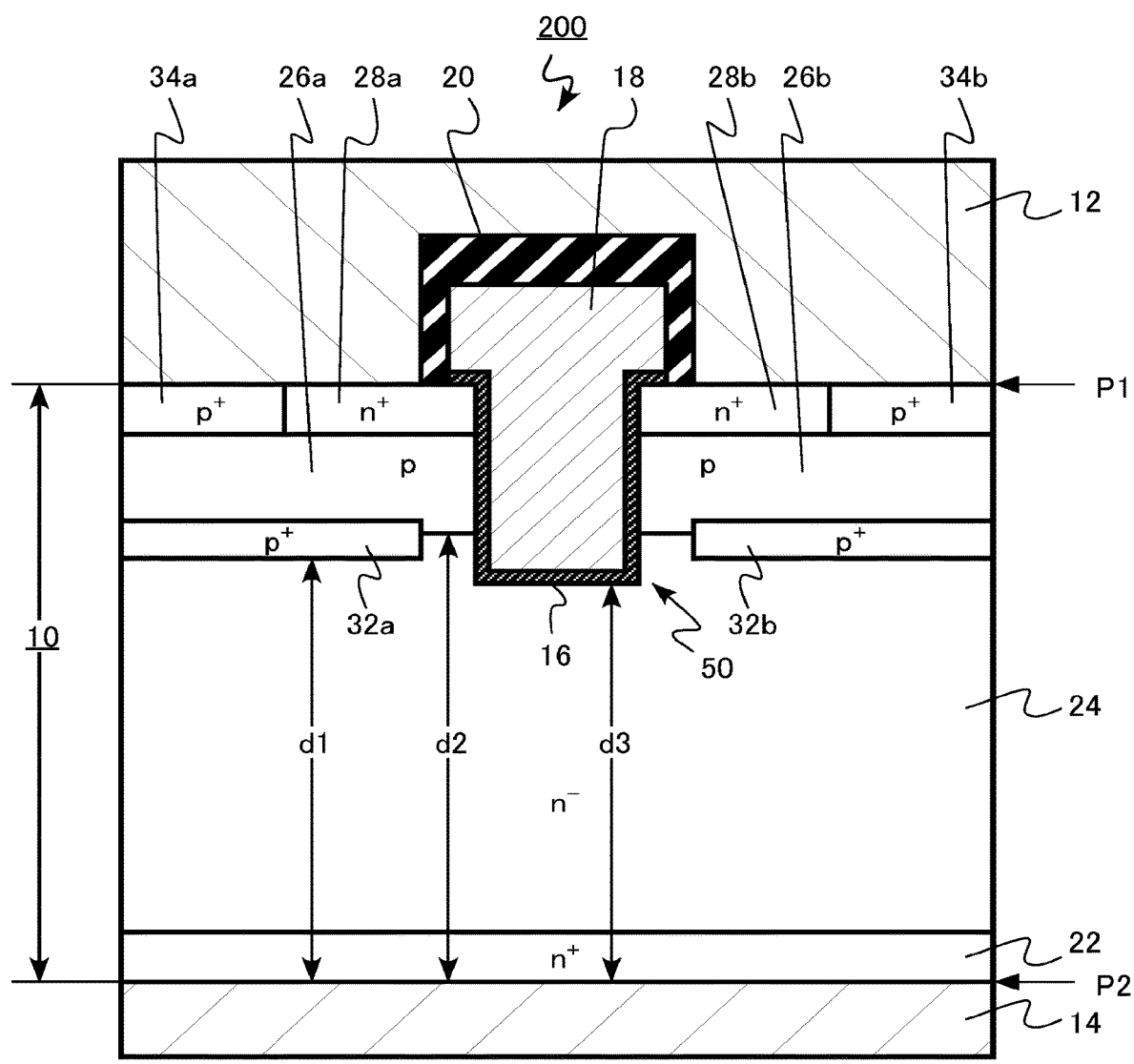
FIG. 19 is a cross-sectional view schematically illustrating a semiconductor device according to a second embodiment.

FIG. 19 is a cross-sectional view schematically illustrating the semiconductor device according to this embodiment. A MOSFET 200 is a trench gate MOSFET.

In the MOSFET 200, a distance ("d1" in FIG. 19) between the second plane and the first high-concentration p region (sixth silicon carbide region) 32a is less than a distance ("d2" in FIG. 19) between the second plane and the first p well region (second silicon carbide region) 26a. In other words, d2−d1 is a positive value. That is, the first high-concentration p region 32a is deeper than the first p well region 26a.

A distance between the second plane and the second high-concentration p region (seventh silicon carbide region) 32b is less than a distance between the second plane and the second p well region 26b. In other words, the second high-concentration p region 32b is deeper than the second p well region 26b.

Figure 20:
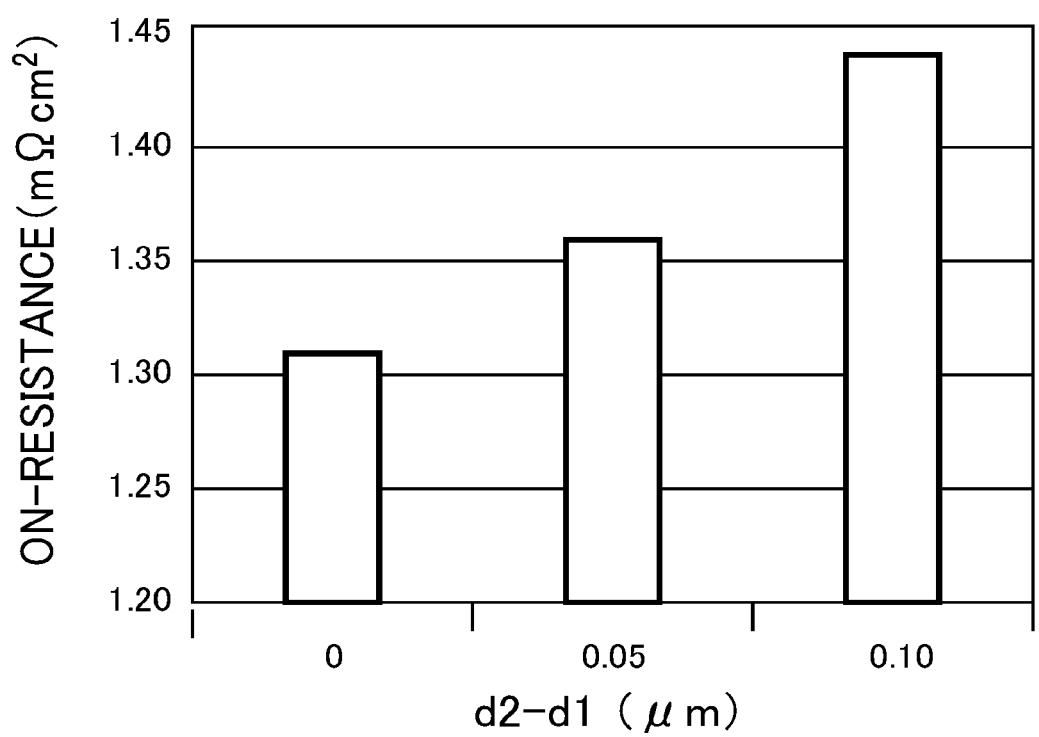
FIG. 20 is a diagram illustrating the function and effect of the semiconductor device according to the second embodiment.

FIG. 20 is a diagram illustrating the function and effect of the semiconductor device according to this embodiment. FIG. 20 is a diagram illustrating the simulation results of the relationship between on-resistance and the difference (d2−d1) between the depth of the high-concentration p region and the depth of the p well region in the MOSFET 200 according to this embodiment.

As can be seen from FIG. 20, on-resistance increases as the difference (d2−d1) between the depth of the high-concentration p region and the depth of the p well region increases. The reason is that the area (or volume) of a portion of the drift region which is interposed between the high-concentration p region and the gate insulating layer increases and the parasitic resistance of the MOSFET 200 increases.

As can be seen from FIG. 20, when the difference (d2−d1) between the depth of the high-concentration p region and the depth of the p well region is equal to or less than 0.1 μm, an increment in the on-resistance is equal to or less than 10%. Therefore, the difference (d2−d1) between the depth of the first high-concentration p region 32a and the depth of the first p well region 26a, that is, the difference (d2−d1) between the distance between the second plane and the first p well region 26a and the distance between the second plane and the first high-concentration p region 32a is preferably equal to or less than 0.1 μm and more preferably equal to or less than 0.05 μm.

The difference between the depth of the second high-concentration p region 32b and the depth of the second p well region 26b, that is, the difference between the distance between the second plane and the second p well region 26b and the distance between the second plane and the second high-concentration p region 32b is preferably equal to or less than 0.1 μm and more preferably equal to or less than 0.05 μm.

It is preferable that the distance ("d1" in FIG. 19) between the second plane and the first high-concentration p region 32a be greater than the distance ("d3" in FIG. 19) between the second plane and the gate insulating layer 16 in order to reduce the area of a portion of the drift region which is interposed between the high-concentration p region and the gate insulating layer. In other words, it is preferable that the depth of the first high-concentration p region 32a be less than the depth of the gate insulating layer 16. It is preferable that the depth of the first high-concentration p region 32a be less than the depth of the trench 50.

Similarly, it is preferable that the distance between the second plane and the second high-concentration p region 32b be greater than the distance between the second plane and the gate insulating layer 16. In other words, it is preferable that the depth of the second high-concentration p region 32b be less than the depth of the gate insulating layer 16. It is preferable that the depth of the second high-concentration p region 32b be less than the depth of the trench 50.

As described above, according to this embodiment, similarly to the first embodiment, the maximum electric field strength of the gate insulating layer 16 is reduced and the MOSFET 200 that can improve the breakdown voltage of the gate insulating layer is achieved.

Third Embodiment

A semiconductor device according to this embodiment is the same as the semiconductor device according to the first embodiment except that the eleventh silicon carbide region comes into contact with the sixth silicon carbide region and the twelfth silicon carbide region comes into contact with the seventh silicon carbide region. Hereinafter, the description of the same content as that in the first embodiment will not be repeated.

Figure 21:
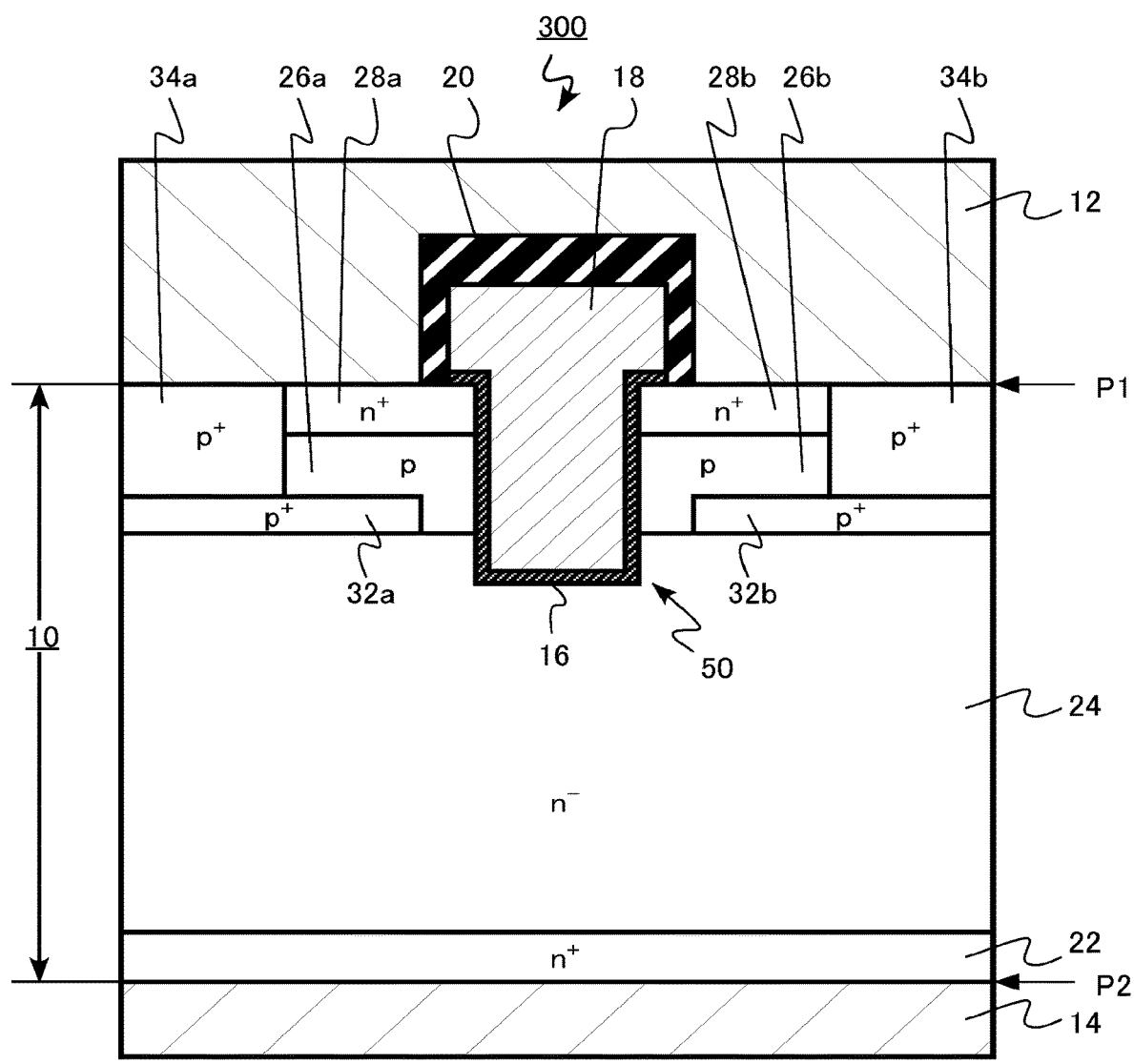
FIG. 21 is a cross-sectional view schematically illustrating a semiconductor device according to a third embodiment.

FIG. 21 is a cross-sectional view schematically illustrating the semiconductor device according to this embodiment. A MOSFET 300 is a trench gate MOSFET.

The first contact region (eleventh silicon carbide region) 34a comes into contact with the first high-concentration p region (sixth silicon carbide region) 32a. In addition, the second contact region (twelfth silicon carbide region) 34b comes into contact with the second high-concentration p region (seventh silicon carbide region) 32b.

In the MOSFET 300, a high-concentration contact region comes into contact with a high-concentration p-type region.

Therefore, when avalanche breakdown occurs, the resistance of a path through which holes are drawn from the source electrode 12 is reduced. As a result, the turn-on operation of a parasitic bipolar transistor is prevented and the resistance of the MOSFET 300 to secondary breakdown is improved.

As described above, according to this embodiment, similarly to the first embodiment, the maximum electric field strength of the gate insulating layer 16 is reduced and the MOSFET 300 that can improve the breakdown voltage of the gate insulating layer is achieved. In addition, the MOSFET 300 having high resistance to secondary breakdown can be achieved.

Fourth Embodiment

A semiconductor device according to this embodiment is the same as the semiconductor device according to the first embodiment except that it further includes: an eighth silicon carbide region of a second conductivity type which is provided such that a distance between the eighth silicon carbide region and the second plane is less than a distance between the second plane and the sixth silicon carbide region, a distance between the eighth silicon carbide region and the gate insulating layer is greater than a distance between the gate insulating layer and the sixth silicon carbide region, comes into contact with the second silicon carbide region or the sixth silicon carbide region, and has a lower second-conductivity-type impurity concentration than the sixth silicon carbide region; and a ninth silicon carbide region of the second conductivity type which is provided such that a distance between the ninth silicon carbide region and the second plane is less than a distance between the second plane and the seventh silicon carbide region, a distance between the ninth silicon carbide region and the gate insulating layer is greater than a distance between the gate insulating layer and the seventh silicon carbide region, comes into contact with the third silicon carbide region or the seventh silicon carbide region, and has a lower second-conductivity-type impurity concentration than the seventh silicon carbide region. Hereinafter, the description of the same content as that in the first embodiment will not be repeated.

Figure 22:
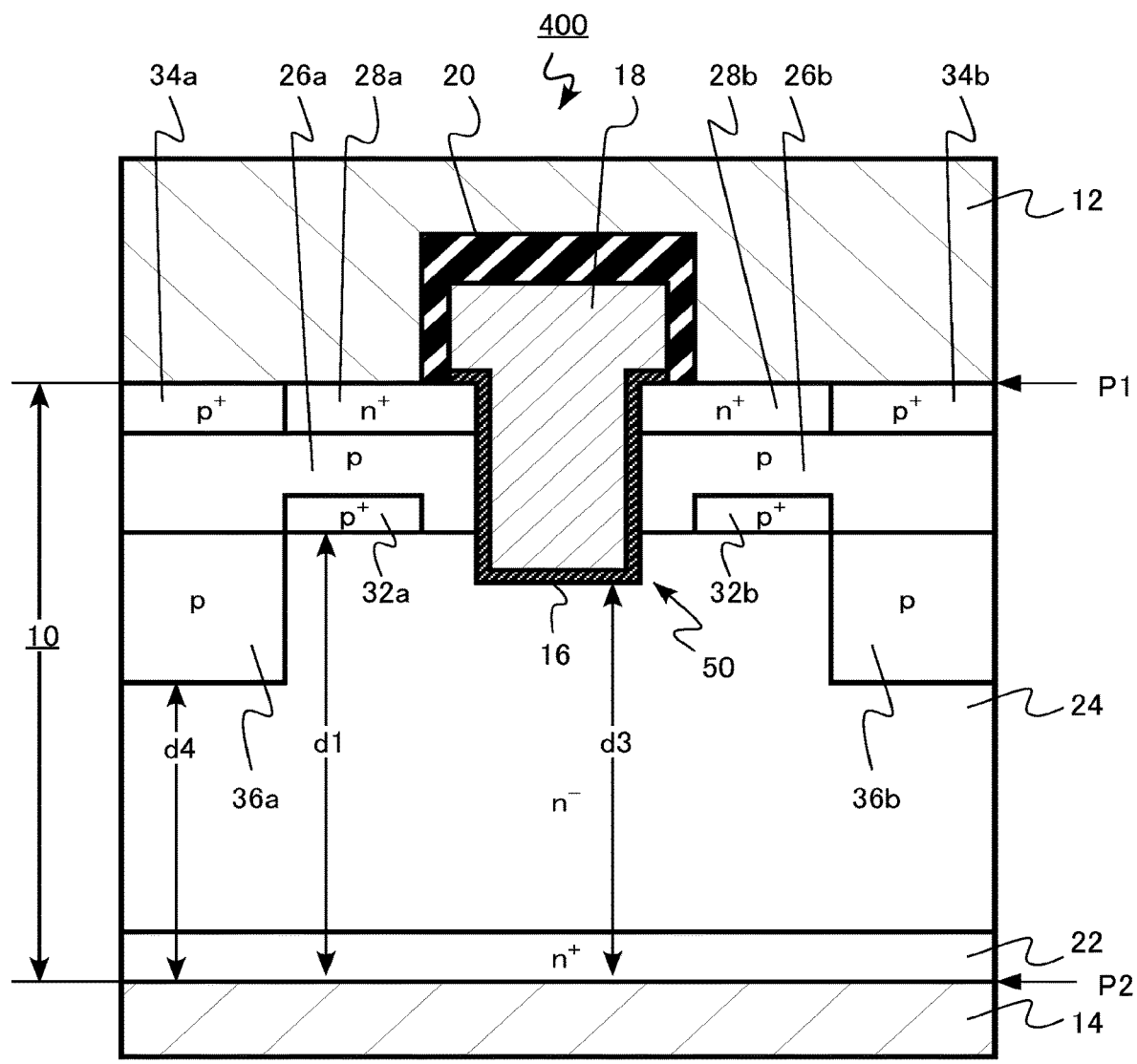
FIG. 22 is a cross-sectional view schematically illustrating a semiconductor device according to a fourth embodiment.

FIG. 22 is a cross-sectional view schematically illustrating the semiconductor device according to this embodiment. A MOSFET 400 is a trench gate MOSFET.

The MOSFET 400 includes a first deep p region (eighth silicon carbide region) 36a and a second deep p region (ninth silicon carbide region) 36b which are provided in the SiC layer 10.

A distance ("d4" in FIG. 22) between the second plane and the first deep p region 36a is less than a distance ("d1" in FIG. 22) between the second plane and the first high-concentration p region 32a. In other words, the depth of the first deep p region 36a is greater than the depth of the first high-concentration p region 32a.

A distance between the first deep p region 36a and the gate insulating layer 16 is greater than a distance between the first high-concentration p region 32a and the gate insulating layer 16. In other words, the first deep p region 36a is provided so as to be farther from the trench 50 than the first high-concentration p region 32a.

The first deep p region 36a is provided so as to come into contact with the first p well region 26a or the first high-concentration p region 32a.

A distance between the second plane and the second deep p region 36b is less than a distance between the second plane and the second high-concentration p region 32b. In other words, the depth of the second deep p region 36b is greater than the depth of the second high-concentration p region 32b.

A distance between the second deep p region 36b and the gate insulating layer 16 is greater than a distance between the second high-concentration p region 32b and the gate insulating layer 16. In other words, the second deep p region 36b is provided so as to be farther from the trench 50 than the second high-concentration p region 32b.

The second deep p region 36b is provided so as to come into contact with the second p well region 26b or the second high-concentration p region 32b.

The first deep p region 36a and the second deep p region 36b are made of p-type SiC. The first deep p region 36a and the second deep p region 36b include, for example, aluminum (Al) as p-type impurities.

The p-type impurity concentration of the first deep p region 36a and the second deep p region 36b is lower than the p-type impurity concentration of the first high-concentration p region 32a and the second high-concentration p region 32b. The p-type impurity concentration of the first deep p region 36a and the second deep p region 36b is, for example, equal to or greater than $5\times10^{15}$ cm$^{-3}$ and equal to or less than $1\times10^{18}$ cm$^{-3}$.

The depth of the first deep p region 36a and the second deep p region 36b is, for example, equal to or greater than 0.6 μm and equal to or less than 2.0 μm.

When the MOSFET 400 is turned off, a portion in which electric field strength is high is formed at the boundary between the first deep p region 36a and the drift region 24 and the boundary between the second deep p region 36b and the drift region 24. Therefore, the concentration of the electric field at the corner of the trench is reduced and the maximum electric field strength of the gate insulating layer 16 is reduced. As a result, the maximum electric field strength of the gate insulating layer 16 is lower than that in the first embodiment.

According to the simulation results, when the first p well region 26a and the second p well region 26b are not combined with the first deep p region 36a and the second deep p region 36b, the maximum electric field strength of the gate insulating layer 16 is 3.7 MV/cm. In contrast, when the first p well region 26a and the second p well region 26b are combined with the first deep p region 36a and the second deep p region 36b, the maximum electric field strength of the gate insulating layer 16 is 3.3 MV/cm.

It is preferable that the distance ("d4" in FIG. 22) between the second plane and the first deep p region 36a be less than the distance ("d3" in FIG. 22) between the second plane and the gate insulating layer 16, in order to reduce the maximum electric field strength of the gate insulating layer 16. In other words, it is preferable that the depth of the first deep p region 36a be greater than the depth of the trench 50.

Similarly, it is preferable that the distance between the second plane and the second deep p region 36b be less than the distance ("d3" in FIG. 22) between the second plane and the gate insulating layer 16. In other words, it is preferable that the depth of the second deep p region 36b is greater than the depth of the trench 50.

As described above, according to this embodiment, the maximum electric field strength of the gate insulating layer 16 is lower than that in the first embodiment and the MOSFET 400 that can further improve the breakdown voltage of the gate insulating layer is achieved.

Fifth Embodiment

A semiconductor device according to this embodiment is the same as the semiconductor device according to the fourth embodiment except that the eighth silicon carbide region and the eleventh silicon carbide region are provided at the bottom of a contact trench and the ninth silicon carbide region and the twelfth silicon carbide region are provided at the bottom of a contact trench. The description of the same content as that in the first embodiment and the fourth embodiment will not be repeated.

Figure 23:
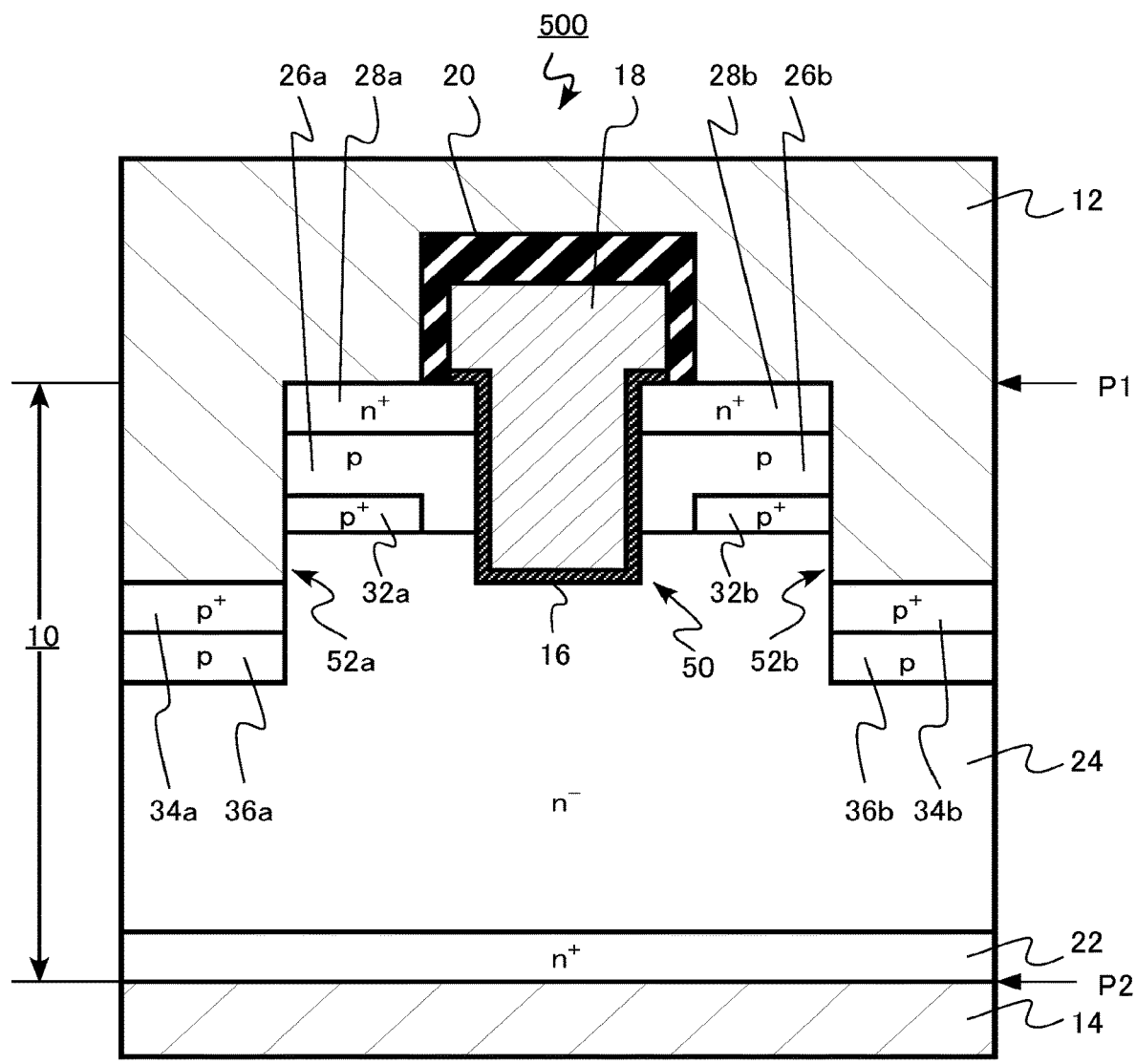
FIG. 23 is a cross-sectional view schematically illustrating a semiconductor device according to a fifth embodiment.

FIG. 23 is a cross-sectional view schematically illustrating the semiconductor device according to this embodiment. A MOSFET 500 is a trench gate MOSFET. The MOSFET 500 is a so-called double trench MOSFET.

The first contact region (eleventh silicon carbide region) 34a and the first deep p region 36a are provided at the bottom of a first contact trench 52a. The second contact region (twelfth silicon carbide region) 34b and the second deep p region 36b are provided at the bottom of a second contact trench 52b.

The MOSFET 500 includes the first deep p region 36a and the second deep p region 36b. Therefore, similarly to the fourth embodiment, the maximum electric field strength of the gate insulating layer 16 is lower than that in the first embodiment and it is possible to further improve the breakdown voltage of the gate insulating layer.

Since the MOSFET 500 includes the first contact trench 52a and the second contact trench 52b, ion implantation with high acceleration energy for forming the first deep p region 36a and the second deep p region 36b is not required. In addition, it is possible to reduce the number of ion implantation processes. Therefore, it is easier to manufacture the semiconductor device than the semiconductor device according to the fourth embodiment.

Sixth Embodiment

A semiconductor device according to this embodiment is the same as the semiconductor device according to the first embodiment except that it further includes a tenth silicon carbide region of a second conductivity type which is provided between the first silicon carbide region and the gate insulating layer and is separated from the second silicon carbide region and the third silicon carbide region. Hereinafter, the description of the same content as that in the first embodiment will not be repeated.

Figure 24:
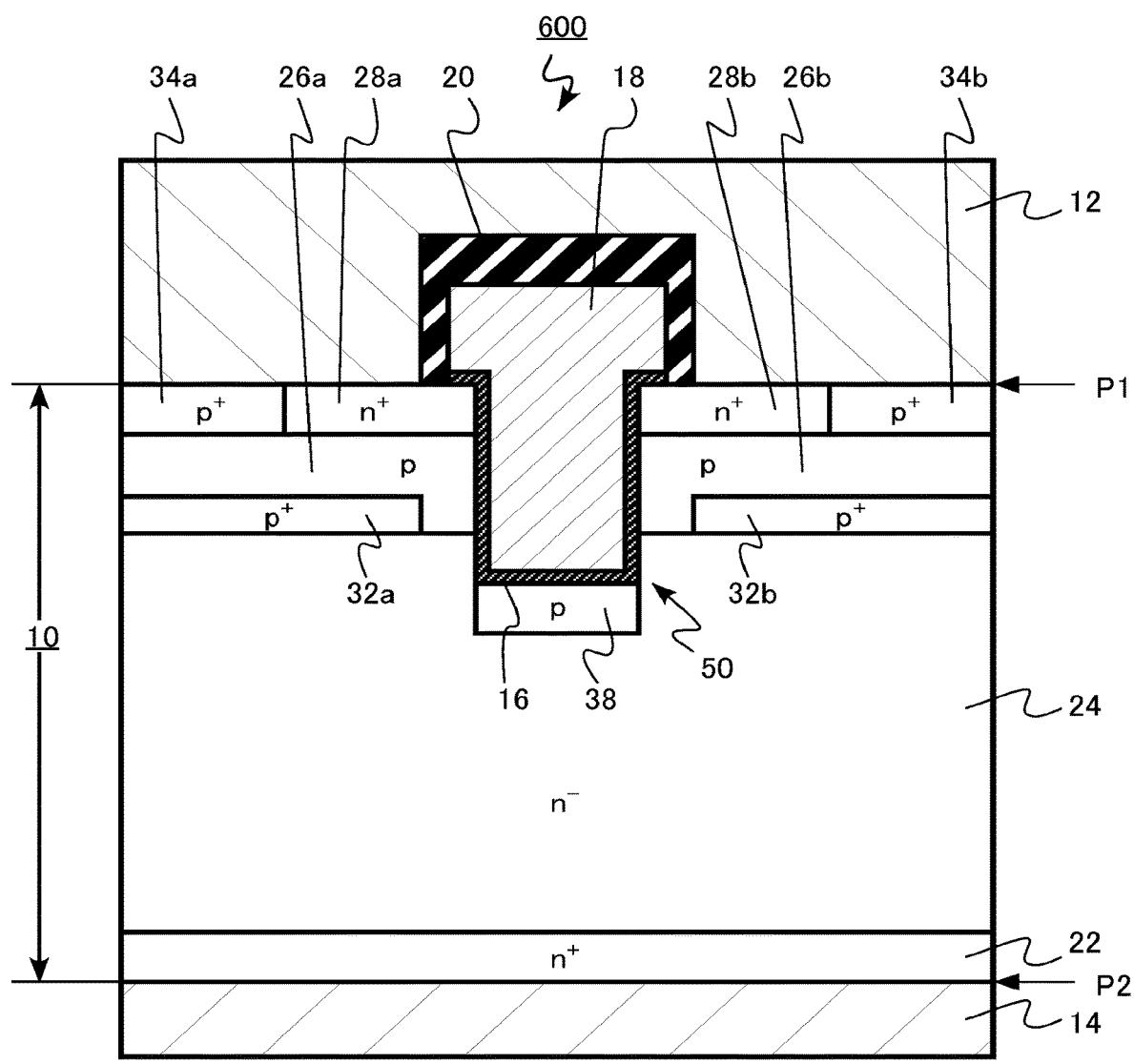
FIG. 24 is a cross-sectional view schematically illustrating a semiconductor device according to a sixth embodiment.

FIG. 24 is a cross-sectional view schematically illustrating the semiconductor device according to this embodiment. A MOSFET 600 is a trench gate MOSFET.

The MOSFET 600 includes a trench bottom p region 38. The trench bottom p region (tenth silicon carbide region) 38 is provided between the drift region 24 and the gate insulating layer 16. In other words, the trench bottom p region 38 is provided at the bottom of the trench 50. The trench bottom p region 38 is provided so as to be separated from the first p well region (second silicon carbide region) 26a and the second p well region (third silicon carbide region) 26b.

The trench bottom p region 38 is made of p-type SiC. The trench bottom p region 38 includes, for example, aluminum (Al) as p-type impurities. The p-type impurity concentration of the trench bottom p region 38 is, for example, equal to or greater than $5 \times 10^{15}$ cm$^{-3}$ and equal to or less than $5 \times 10^{18}$ cm$^{-3}$.

When the MOSFET 600 is turned off, a portion in which electric field strength is high is formed at the boundary between the trench bottom p region 38 and the drift region. Therefore, the concentration of the electric field on the corner of the trench is reduced and the maximum electric field strength of the gate insulating layer 16 is reduced. As a result, the maximum electric field strength of the gate insulating layer 16 is lower than that in the first embodiment.

According to the simulation results, when the first p well region 26a and the second p well region 26b are not combined with the trench bottom p region 38, the maximum electric field strength of the gate insulating layer 16 is 2.6 MV/cm. In contrast, when the first p well region 26a and the second p well region 26b are combined with the trench bottom p region 38, the maximum electric field strength of the gate insulating layer 16 is 1.8 MV/cm.

As described above, according to this embodiment, the maximum electric field strength of the gate insulating layer 16 is lower than that in the first embodiment and the MOSFET 600 that can further improve the breakdown voltage of the gate insulating layer is achieved.

Seventh Embodiment

A semiconductor device according to this embodiment is the same as the semiconductor device according to the first embodiment except that the thickness of the gate insulating layer between the first silicon carbide region and the gate electrode is greater than the thickness of the gate insulating layer between the second silicon carbide region and the gate electrode and the thickness of the gate insulating layer between the third silicon carbide region and the gate electrode. Hereinafter, the description of the same content as that in the first embodiment will not be repeated.

Figure 25:
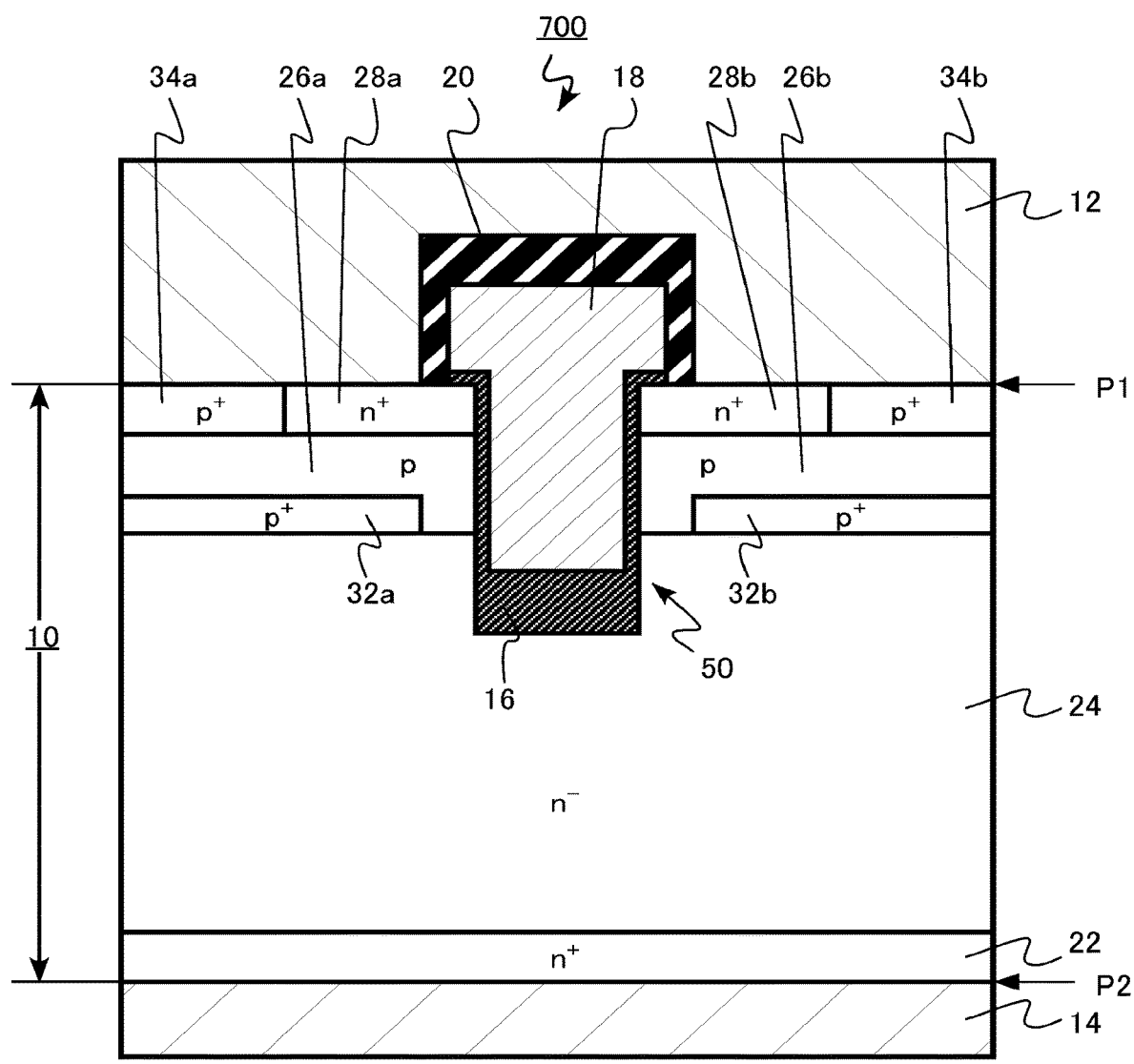
FIG. 25 is a cross-sectional view schematically illustrating a semiconductor device according to a seventh embodiment.

FIG. 25 is a cross-sectional view schematically illustrating the semiconductor device according to this embodiment. A MOSFET 700 is a trench gate MOSFET.

In the MOSFET 700, the thickness of the gate insulating layer 16 between the drift region (first silicon carbide region) 24 and the gate electrode 18 is greater than the thickness of the gate insulating layer 16 between the first p well region (second silicon carbide region) 26a and the gate electrode 18. In addition, the thickness of the gate insulating layer 16 between the drift region (first silicon carbide region) 24 and the gate electrode 18 is greater than the thickness of the gate insulating layer 16 between the second p well region (third silicon carbide region) 26b and the gate electrode 18.

In other words, the thickness of a portion of the gate insulating layer 16 which comes into contact with the bottom of the trench 50 is greater than the thickness of a portion of the gate insulating layer 16 which comes into contact with the side surface of the trench 50.

When the MOSFET 700 is turned off, the concentration of the electric field on the corner of the trench is reduced by the thick portion of the gate insulating layer 16 at the bottom of the trench 50 and the maximum electric field strength of the gate insulating layer 16 is reduced. Therefore, the maximum electric field strength of the gate insulating layer 16 is lower than that in the first embodiment.

As described above, according to this embodiment, the maximum electric field strength of the gate insulating layer 16 is lower than that in the first embodiment and the MOSFET 700 that can further improve the breakdown voltage of the gate insulating layer is achieved.

Eighth Embodiment

An inverter circuit and a driving device according to this embodiment includes the semiconductor device according to the first embodiment.

Figure 26:
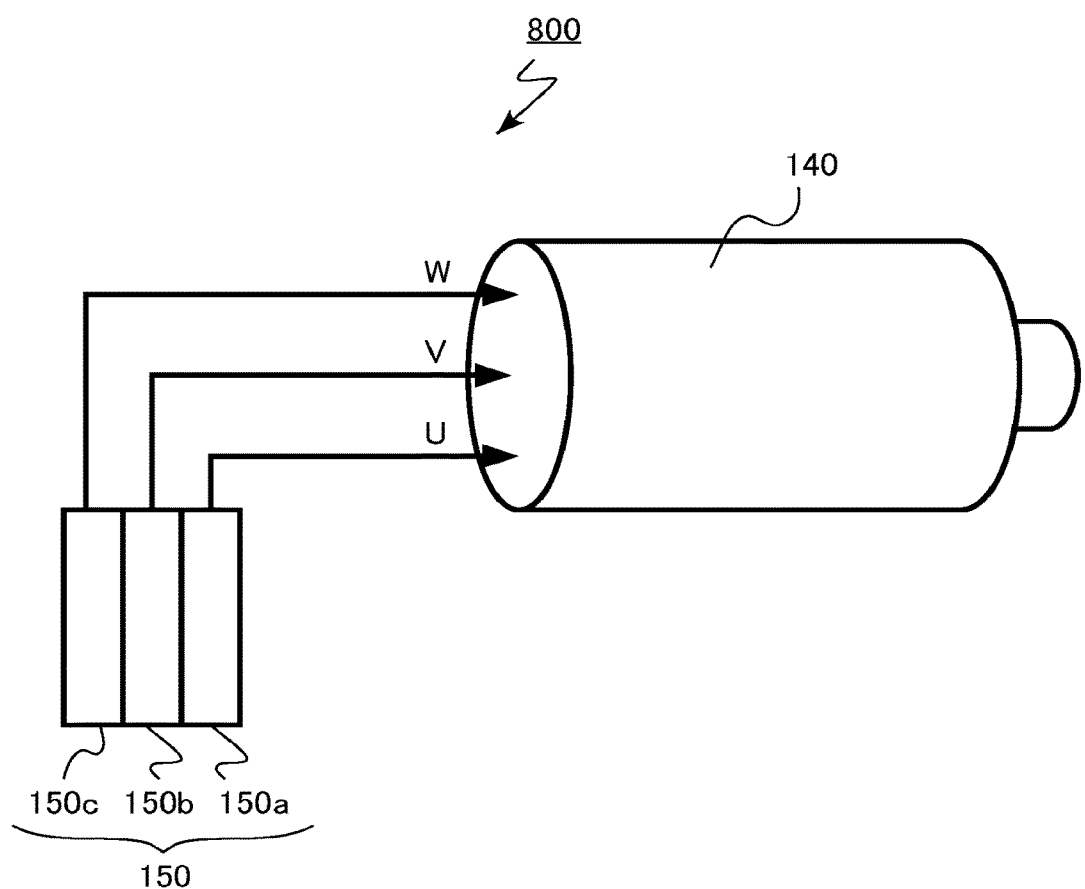
FIG. 26 is a diagram schematically illustrating a driving device according to an eighth embodiment.

FIG. 26 is a diagram schematically illustrating the driving device according to this embodiment. A driving device 800 includes a motor 140 and an inverter circuit 150.

The inverter circuit 150 includes three semiconductor modules 150a, 150b, and 150c having the MOSFET 100 according to the first embodiment as a switching element. The three semiconductor modules 150a, 150b, and 150c are connected in parallel to each other to form the three-phase inverter circuit 150 including three AC voltage output terminals U, V, and W. The motor 140 is drive by an AC voltage which is output from the inverter circuit 150.

According to this embodiment, since the inverter circuit includes the MOSFET 100 with improved characteristics, it is possible to improve the characteristics of the inverter circuit 150 and the driving device 800.

Ninth Embodiment

A vehicle according to this embodiment includes the semiconductor device according to the first embodiment.

Figure 27:
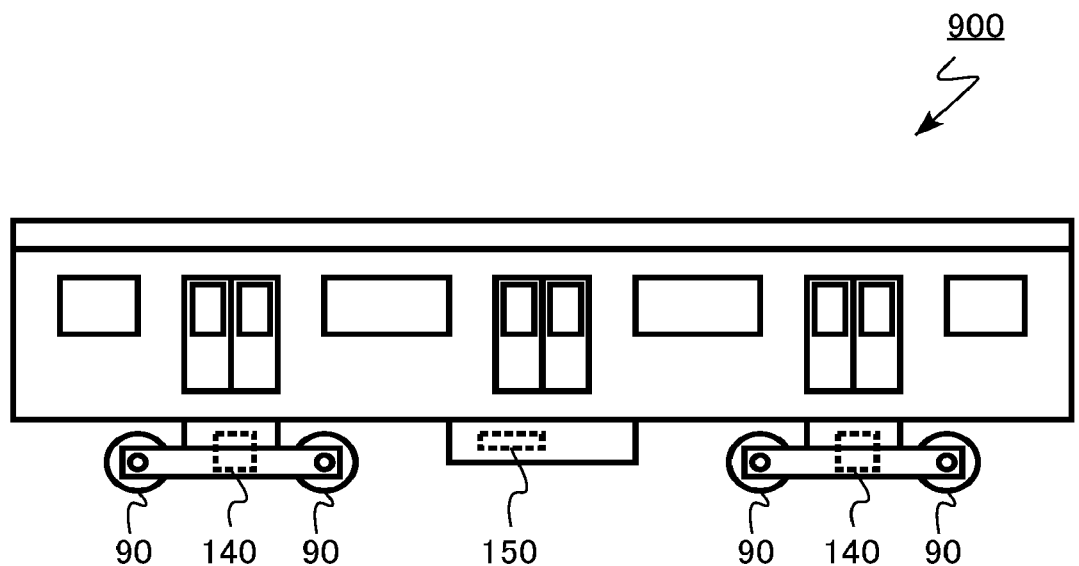
FIG. 27 is a diagram schematically illustrating a vehicle according to a ninth embodiment.

FIG. 27 is a diagram schematically illustrating the vehicle according to this embodiment. A vehicle 900 according to this embodiment is a railway vehicle. The vehicle 900 includes a motor 140 and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W. The motor 140 is driven by an AC voltage which is output from the inverter circuit 150. Wheels 90 of the vehicle 900 are rotated by the motor 140.

According to this embodiment, since the vehicle 900 includes the MOSFET 100 with improved characteristics, the characteristics of the vehicle 900 are improved.

Tenth Embodiment

A vehicle according to this embodiment includes the semiconductor device according to the fifth embodiment.

Figure 28:
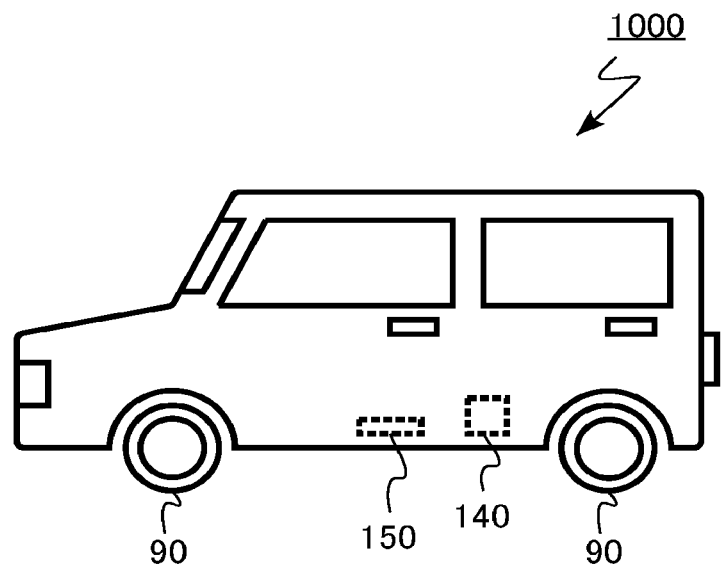
FIG. 28 is a diagram schematically illustrating a vehicle according to a tenth embodiment.

FIG. 28 is a diagram schematically illustrating the vehicle according to this embodiment. A vehicle 1000 according to this embodiment is a car. The vehicle 1000 includes a motor 140 and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W.

The motor 140 is driven by an AC voltage which is output from the inverter circuit 150. Wheels 90 of the vehicle 1000 are rotated by the motor 140.

According to this embodiment, since the vehicle 1000 includes the MOSFET 100 with improved characteristics, the characteristics of the vehicle 1000 are improved.

Eleventh Embodiment

An elevator according to this embodiment includes the semiconductor device according to the first embodiment.

Figure 29:
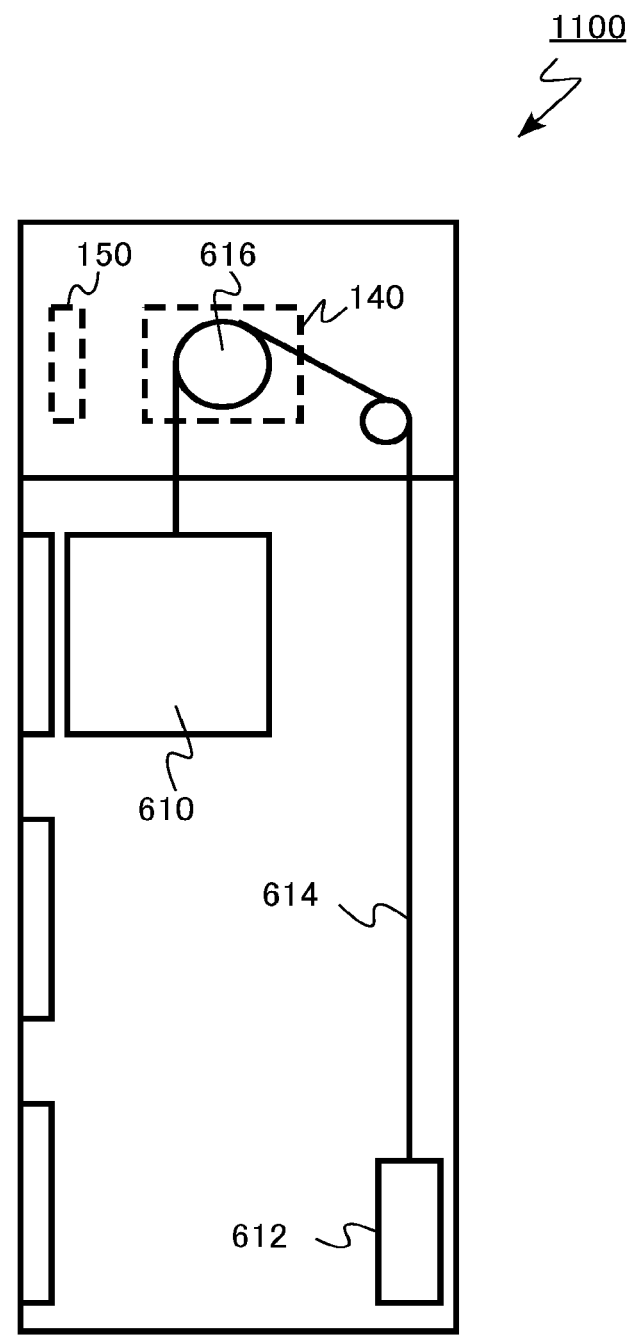
FIG. 29 is a diagram schematically illustrating an elevator according to an eleventh embodiment.

FIG. 29 is a diagram schematically illustrating the elevator according to this embodiment. An elevator 1100 according to this embodiment includes a basket 610, a counter weight 612, a wire rope 614, a hoist 616, a motor 140, and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W.

The motor 140 is driven by an AC voltage which is output from the inverter circuit 150. The hoist 616 is rotated by the motor 140 to move up and down the basket 610.

According to this embodiment, since the elevator 1100 includes the MOSFET 100 with improved characteristics, the characteristics of the elevator 1100 are improved.

In the first to seventh embodiments, the MOSFET is given as an example of the semiconductor device. However, the invention may be applied to an insulated gate bipolar transistor (IGBT).

In the first to seventh embodiments, an example in which the first conductivity type is an n type and the second conductivity type is a p type has been described. However, the first conductivity type may be a p type and the second conductivity type may be an n type.

In the first to seventh embodiments, an example in which the SiC layer is made of 4H—SiC has been described above. However, the invention can be applied to other crystal forms such as 3C—SiC and 6H—SiC.

In the first to seventh embodiments, it is preferable that the n-type impurity be, for example, nitrogen (N) or phosphorus (P). However, the n-type impurity may be, for example, arsenic (As) or antimony (Sb). It is preferable that the p-type impurity be, for example, aluminum (Al). However, the p-type impurity may be, for example, boron (B), gallium (Ga), or indium (In).

For example, the components described in the first to seventh embodiments may be combined with each other in order to reduce the maximum electric field strength of the gate insulating layer 16.

In the ninth to eleventh embodiments, an example in which the semiconductor device according to the invention is applied to the vehicle or the elevator has been described. However, the semiconductor device according to the invention may be applied to, for example, a power conditioner of a photovoltaic power generation system.

While certain embodiments have been described, these embodiments have been presented by way of example only, and are not intended to limit the scope of the inventions. Indeed, the semiconductor device, the semiconductor device manufacturing method, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
  a silicon carbide layer having a front surface and a rear surface, the front surface and the rear surface being substantially parallel;
  a first silicon carbide region of a first conductivity type provided in the silicon carbide layer;
  a second silicon carbide region of a second conductivity type provided between the first silicon carbide region and the front surface;

a third silicon carbide region of the second conductivity type provided between the first silicon carbide region and the front surface;

a fourth silicon carbide region of the first conductivity type provided between the second silicon carbide region and the front surface;

a fifth silicon carbide region of the first conductivity type provided between the third silicon carbide region and the front surface;

a gate electrode having a portion provided between the second silicon carbide region and the third silicon carbide region;

a gate insulating layer having a portion provided between the second silicon carbide region and the gate electrode and a portion between the third silicon carbide region and the gate electrode;

a sixth silicon carbide region of the second conductivity type provided between the first silicon carbide region and the second silicon carbide region, a part of the second silicon carbide region being interposed between the sixth silicon carbide region and the gate insulating layer in an imaginary plane parallel to the front surface, and the sixth silicon carbide region having a higher second-conductivity-type impurity concentration than the second silicon carbide region; and a seventh silicon carbide region of the second conductivity type provided between the first silicon carbide region and the third silicon carbide region, a part of the third silicon carbide region being interposed between the seventh silicon carbide region and the gate insulating layer in the imaginary plane parallel to the front surface, and the seventh silicon carbide region having a higher second-conductivity-type impurity concentration than the third silicon carbide region, wherein a distance between the rear surface and the sixth silicon carbide region is greater than a distance between the rear surface and the gate electrode, and a distance between the rear surface and the seventh silicon carbide region is greater than a distance between the rear surface and the gate electrode.

2. The semiconductor device according to claim 1,
wherein the second-conductivity-type impurity concentration of the sixth silicon carbide region is equal to or greater than $5 \times 10^{17}$ cm$^{-3}$, and
the second-conductivity-type impurity concentration of the seventh silicon carbide region is equal to or greater than $5 \times 10^{17}$ cm$^{-3}$.

3. The semiconductor device according to claim 1,
wherein the second-conductivity-type impurity concentration of the sixth silicon carbide region is higher than the second-conductivity-type impurity concentration of the second silicon carbide region by one digit or more, and
the second-conductivity-type impurity concentration of the seventh silicon carbide region is higher than the second-conductivity-type impurity concentration of the third silicon carbide region by one digit or more.

4. The semiconductor device according to claim 1,
wherein a distance between the sixth silicon carbide region and the gate insulating layer is equal to or greater than 0.05 μm and equal to or less than 0.7 μm, and
a distance between the seventh silicon carbide region and the gate insulating layer is equal to or greater than 0.05 μm and equal to or less than 0.7 μm.

5. The semiconductor device according to claim 1,
wherein a difference between a distance between the rear surface and the second silicon carbide region and a distance between the rear surface and the sixth silicon carbide region is equal to or less than 0.1 μm, and
a difference between a distance between the rear surface and the third silicon carbide region and a distance between the rear surface and the seventh silicon carbide region is equal to or less than 0.1 μm.

6. The semiconductor device according to claim 1, further comprising:
an eighth silicon carbide region of the second conductivity type having a lower second-conductivity-type impurity concentration than the sixth silicon carbide region, a distance between the rear surface and the eighth silicon carbide region is less than a distance between the rear surface and the sixth silicon carbide region, a distance between the gate insulating layer and the eighth silicon carbide region is greater than a distance between the gate insulating layer and the sixth silicon carbide region, the eighth silicon carbide region being in contact with at least one of the second silicon carbide region and the sixth silicon carbide region; and
a ninth silicon carbide region of the second conductivity type having a lower second-conductivity-type impurity concentration than the seventh silicon carbide region, a distance between the rear surface and the ninth silicon carbide region is less than a distance between the rear surface and the seventh silicon carbide region, a distance between the gate insulating layer and the ninth silicon carbide region is greater than a distance between the gate insulating layer and the seventh silicon carbide region, the ninth silicon carbide region being in contact with at least one of the third silicon carbide region and the seventh silicon carbide region.

7. The semiconductor device according to claim 1, further comprising:
a tenth silicon carbide region of the second conductivity type provided between the first silicon carbide region and the gate insulating layer, the tenth silicon carbide region being separated from the second silicon carbide region and the third silicon carbide region.

8. The semiconductor device according to claim 1,
wherein a thickness of the gate insulating layer between the first silicon carbide region and the gate electrode is greater than a thickness of the gate insulating layer between the second silicon carbide region and the gate electrode and the thickness of the gate insulating layer between the first silicon carbide region and the gate electrode is greater than a thickness of the gate insulating layer between the third silicon carbide region and the gate electrode.

9. The semiconductor device according to claim 1, further comprising:
an eleventh silicon carbide region of the second conductivity type being in contact with the front surface, the fourth silicon carbide region being interposed between the eleventh silicon carbide region and the gate insulating layer, and the eleventh silicon carbide region having a higher second-conductivity-type impurity concentration than the second silicon carbide region; and
a twelfth silicon carbide region of the second conductivity type being in contact with the front surface, the fifth silicon carbide region being interposed between the twelfth silicon carbide region and the gate insulating layer, and the twelfth silicon carbide region having a higher second-conductivity-type impurity concentration than the third silicon carbide region.

10. The semiconductor device according to claim 9, wherein the eleventh silicon carbide region being into contact with the sixth silicon carbide region and the twelfth silicon carbide region being in contact with the seventh silicon carbide region.

11. The semiconductor device according to claim 1, wherein the gate insulating layer includes silicon oxide.

12. An inverter circuit comprising:
the semiconductor device according to claim 1.

13. A driving device comprising:
the semiconductor device according to claim 1.

14. A vehicle comprising:
the semiconductor device according to claim 1.

15. An elevator comprising:
the semiconductor device according to claim 1.

16. The semiconductor device according to claim 1, wherein the sixth silicon carbide region is in contact with the first silicon carbide region, and
the seventh silicon carbide region is in contact with the first silicon carbide region.

17. The semiconductor device according to claim 1, wherein an absolute difference between a distance between the rear surface and the second silicon carbide region and a distance between the rear surface and the sixth silicon carbide region is equal to or less than 0.05 µm, and
an absolute difference between a distance between the rear surface and the third silicon carbide region and a distance between the rear surface and the seventh silicon carbide region is equal to or less than 0.05 µm.

18. The semiconductor device according to claim 1, wherein a distance between the rear surface and the second silicon carbide region is equal to or less than a distance between the rear surface and the sixth silicon carbide region, and
a distance between the rear surface and the third silicon carbide region is equal to or less than a distance between the rear surface and the seventh silicon carbide region.

19. The semiconductor device according to claim 9, wherein a distance between the eleventh silicon carbide region and the gate insulating layer is larger than a distance between the sixth silicon carbide region and the gate insulating layer, and
a distance between the twelfth silicon carbide region and the gate insulating layer is larger than a distance between the seventh silicon carbide region and the gate insulating layer.

20. The semiconductor device according to claim 1, wherein a distance between the sixth silicon carbide region and the gate insulating layer is equal to or greater than 0.05 µm and equal to or less than 0.4 µm, and
a distance between the seventh silicon carbide region and the gate insulating layer is equal to or greater than 0.05 µm and equal to or less than 0.4 µm.

21. The semiconductor device according to claim 1, wherein a distance between an end of the fourth silicon carbide region opposite to the gate insulating layer and the gate insulating layer is greater than a distance between the sixth silicon carbide region and the gate insulating layer, and
a distance between an end of the fifth silicon carbide region opposite to the gate insulating layer and the gate insulating layer is greater than a distance between the seventh silicon carbide region and the gate insulating layer.

22. The semiconductor device according to claim 1, wherein a distance between the sixth silicon carbide region and the gate insulating layer is equal to or greater than 0.1 µm, and
a distance between the seventh silicon carbide region and the gate insulating layer is equal to or greater than 0.1 µm.

23. The semiconductor device according to claim 1, wherein a thickness of the sixth silicon carbide region in a direction from the front surface to the rear surface is equal to or less than 0.2 µm, and
a thickness of the seventh silicon carbide region in the direction is equal to or less than 0.2 µm.

* * * * *